United States Patent
Yu et al.

(10) Patent No.: US 9,865,698 B2
(45) Date of Patent: Jan. 9, 2018

(54) SEMICONDUCTOR DEVICE BLOCKING LEAKAGE CURRENT AND METHOD OF FORMING THE SAME

(71) Applicant: SAMSUNG ELECTRONICS CO., LTD., Suwon-si, Gyeonggi-Do (KR)

(72) Inventors: Hyun-Kwan Yu, Suwon-si (KR); Kooktae Kim, Hwaseong-si (KR); Chanjin Park, Yongin-si (KR); Dongsuk Shin, Yongin-si (KR); Youngdal Lim, Suwon-si (KR); Sahwan Hong, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/053,842

(22) Filed: Feb. 25, 2016

(65) Prior Publication Data

US 2016/0359012 A1  Dec. 8, 2016

(30) Foreign Application Priority Data

Jun. 8, 2015 (KR) ........................ 10-2015-0080591

(51) Int. Cl.
*H01L 27/108* (2006.01)
*H01L 29/49* (2006.01)
(Continued)

(52) U.S. Cl.
CPC .. *H01L 29/4991* (2013.01); *H01L 21/823431* (2013.01); *H01L 21/823481* (2013.01); *H01L 27/0886* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/7848* (2013.01)

(58) Field of Classification Search
CPC ......... H01L 21/76264; H01L 21/76289; H01L 21/764; H01L 21/7682; H01L 23/4821; H01L 29/0649; H01L 29/4991; H01L 21/823431; H01L 21/823821; H01L 21/845; H01L 27/0886; H01L 27/10826; H01L 27/10879; H01L 29/41791; H01L 29/66795
See application file for complete search history.

(56) References Cited

U.S. PATENT DOCUMENTS 8,377,779 B1  2/2013 Wang
8,679,925 B2  3/2014 Wang
(Continued)

FOREIGN PATENT DOCUMENTS

KR  101374489  3/2014

OTHER PUBLICATIONS

US 8,629,024, 01/2014, Wang (withdrawn)

*Primary Examiner* — Bitew Dinke
(74) *Attorney, Agent, or Firm* — F. Chau & Associates, LLC

(57) ABSTRACT

A semiconductor device includes a gate assembly disposed on a device isolation layer, a gate spacer disposed on a side surface of the gate assembly, a contact assembly disposed on the gate spacer, an air gap disposed between the device isolation layer and the contact assembly, and a first spacer capping layer disposed between the gate spacer and the air gap. The first spacer capping layer has an etch selectivity with respect to the gate spacer.

16 Claims, 33 Drawing Sheets

(51) Int. Cl.
*H01L 29/08* (2006.01)
*H01L 29/16* (2006.01)
*H01L 29/161* (2006.01)
*H01L 29/165* (2006.01)
*H01L 29/78* (2006.01)
*H01L 29/06* (2006.01)
*H01L 21/8234* (2006.01)
*H01L 27/088* (2006.01)

(56) References Cited

U.S. PATENT DOCUMENTS

| | | | |
|---|---|---|---|
| 8,697,539 B2 | 4/2014 | Huang et al. | |
| 8,878,300 B1 | 11/2014 | Liu et al. | |
| 9,035,419 B2* | 5/2015 | Oh | H01L 21/28273 257/410 |
| 2013/0171790 A1* | 7/2013 | Wang | H01L 29/66795 438/283 |
| 2014/0001520 A1* | 1/2014 | Glass | H01L 29/66439 257/288 |
| 2014/0203370 A1* | 7/2014 | Maeda | H01L 29/785 257/365 |
| 2014/0217517 A1* | 8/2014 | Cai | H01L 27/0886 257/401 |
| 2014/0370672 A1 | 12/2014 | Kim et al. | |
| 2015/0079751 A1* | 3/2015 | Alptekin | H01L 29/785 438/283 |
| 2015/0099340 A1* | 4/2015 | Yu | H01L 29/66795 438/285 |
| 2015/0303118 A1* | 10/2015 | Wang | H01L 21/823481 257/401 |
| 2016/0148846 A1* | 5/2016 | Ok | H01L 21/28008 257/369 |
| 2016/0204105 A1* | 7/2016 | Zeng | H01L 27/0886 257/401 |
| 2016/0293749 A1* | 10/2016 | Park | H01L 29/785 |
| 2016/0308004 A1* | 10/2016 | Lee | H01L 29/847 |
| 2016/0315081 A1* | 10/2016 | Park | H01L 27/0886 |

* cited by examiner

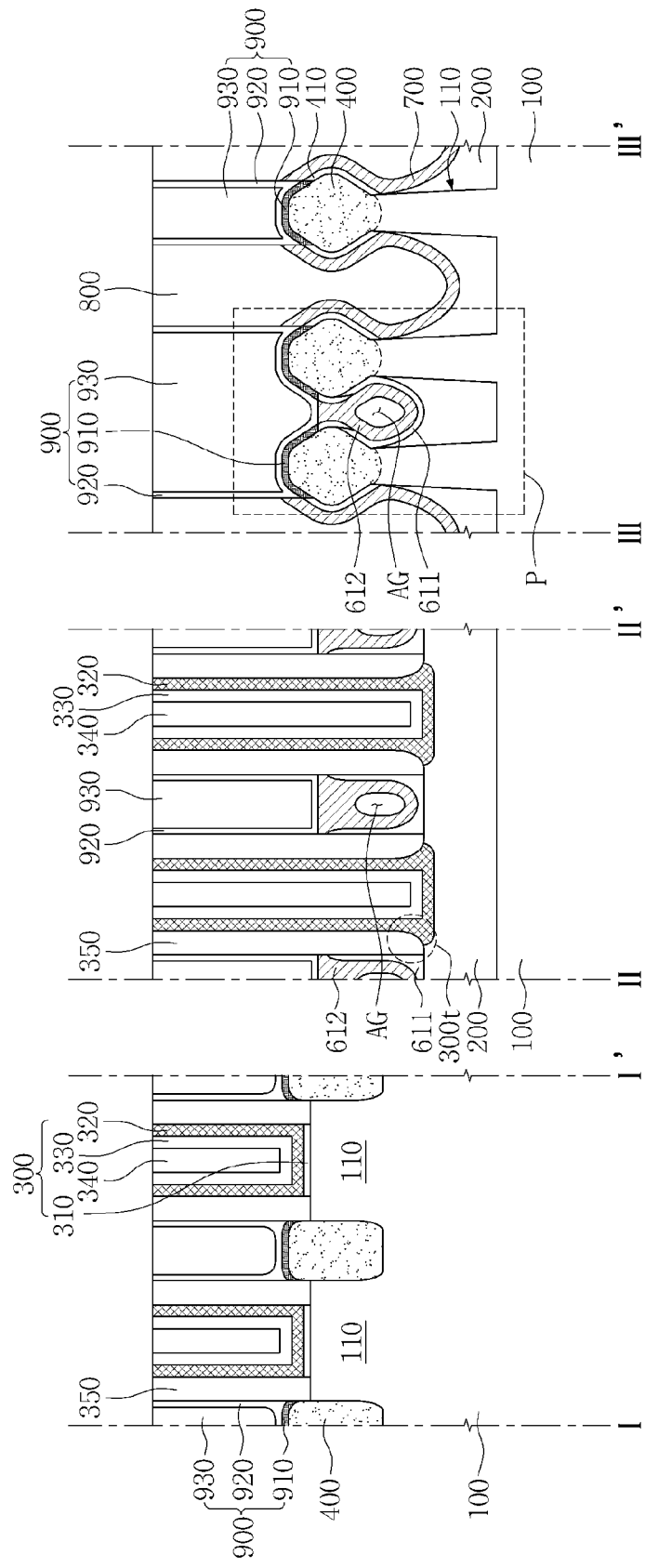

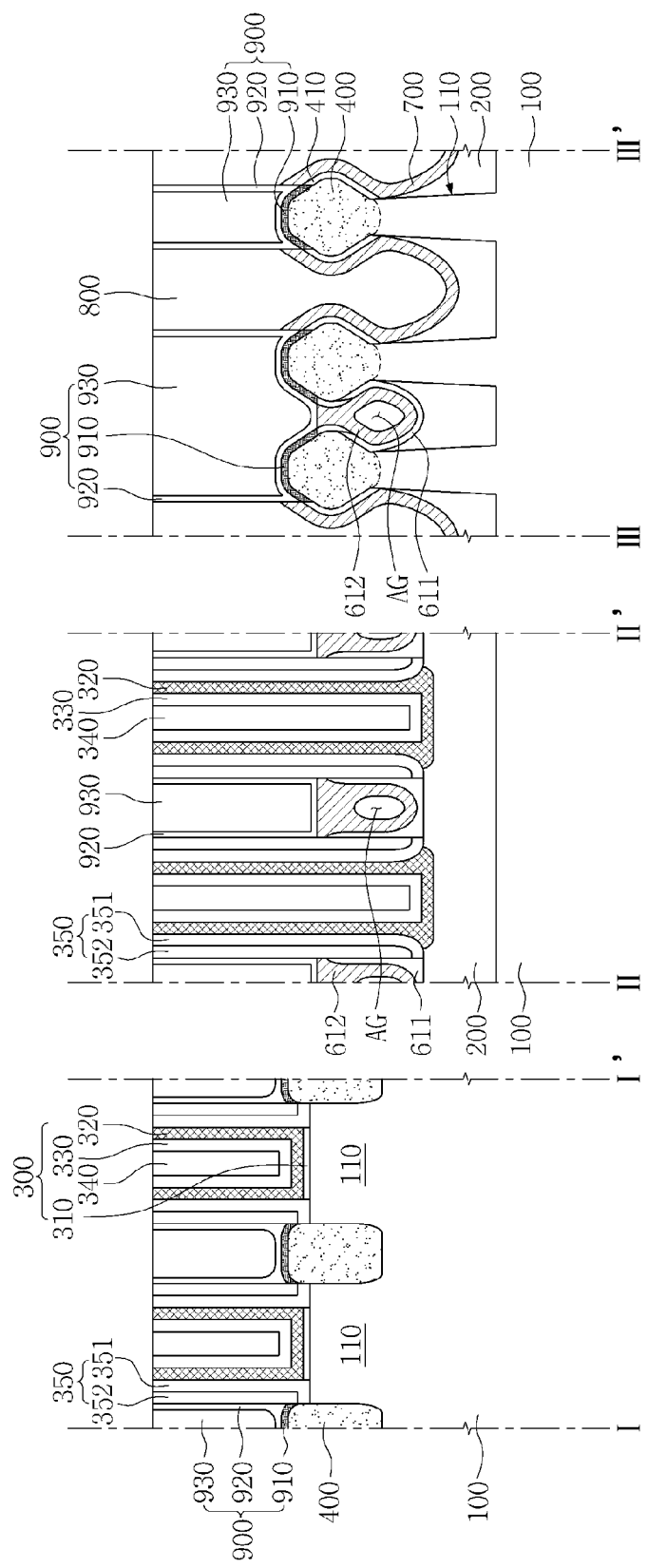

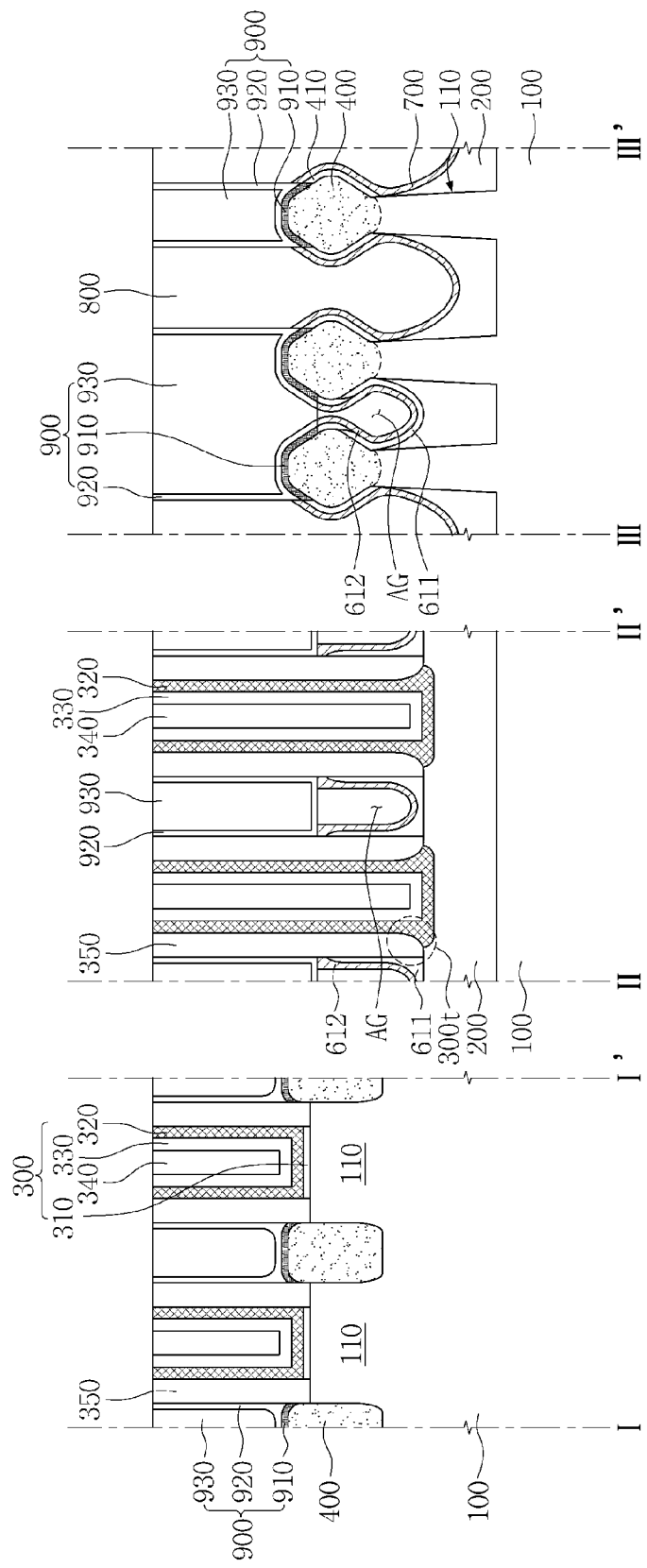

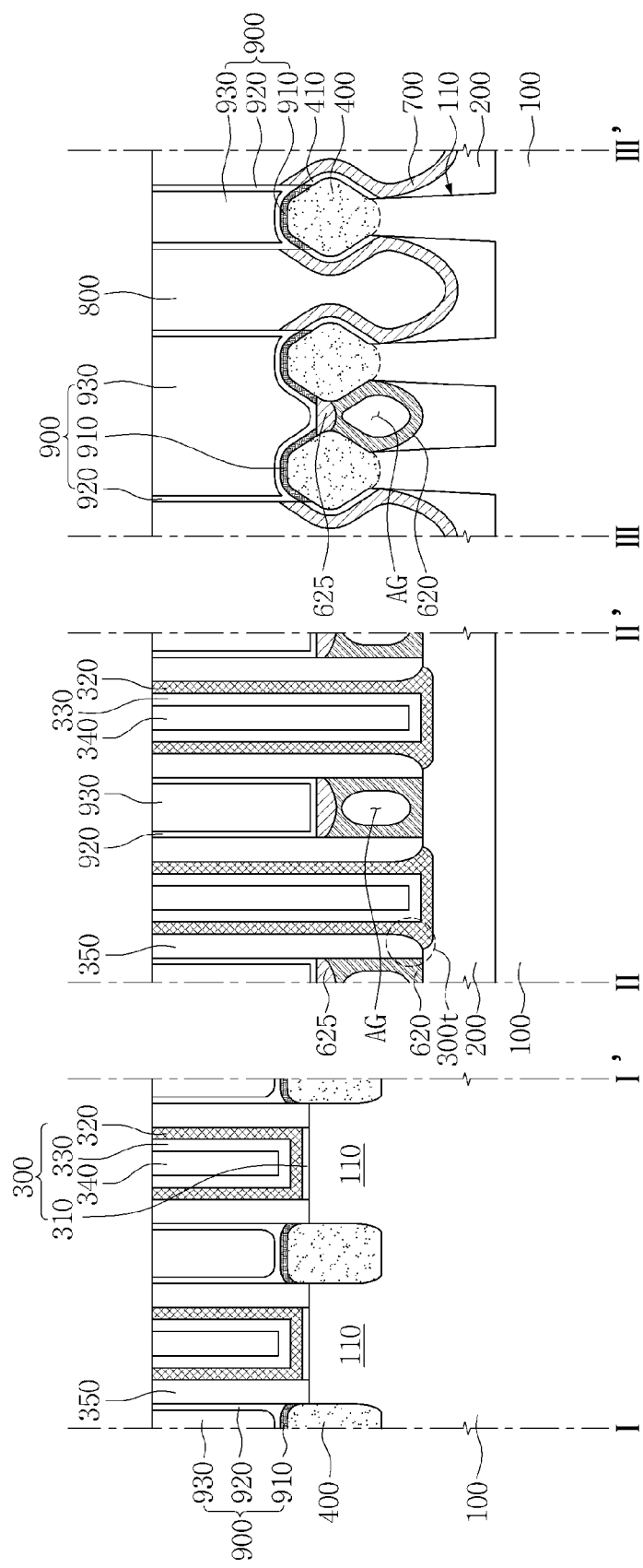

FIG. 6A FIG. 6B FIG. 6C

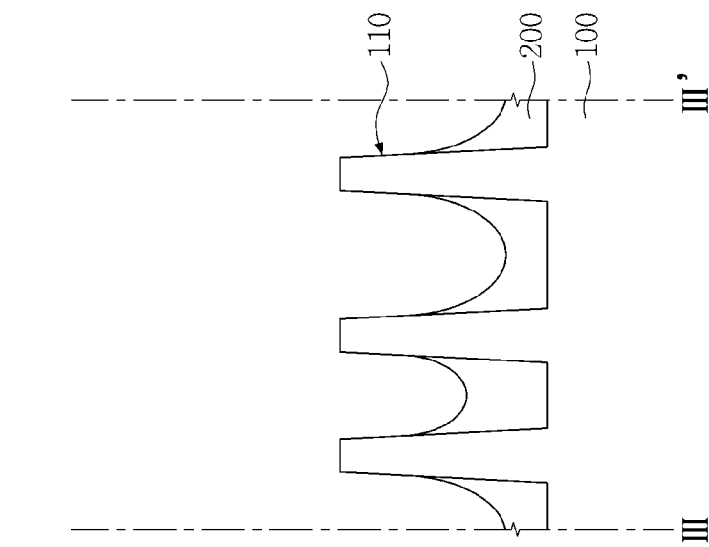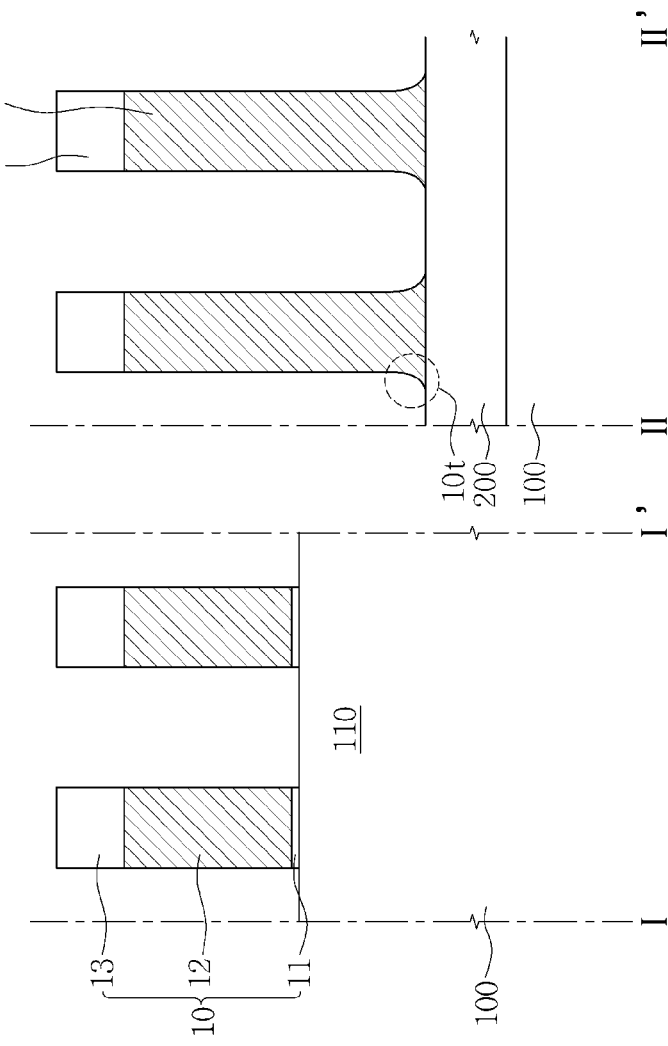

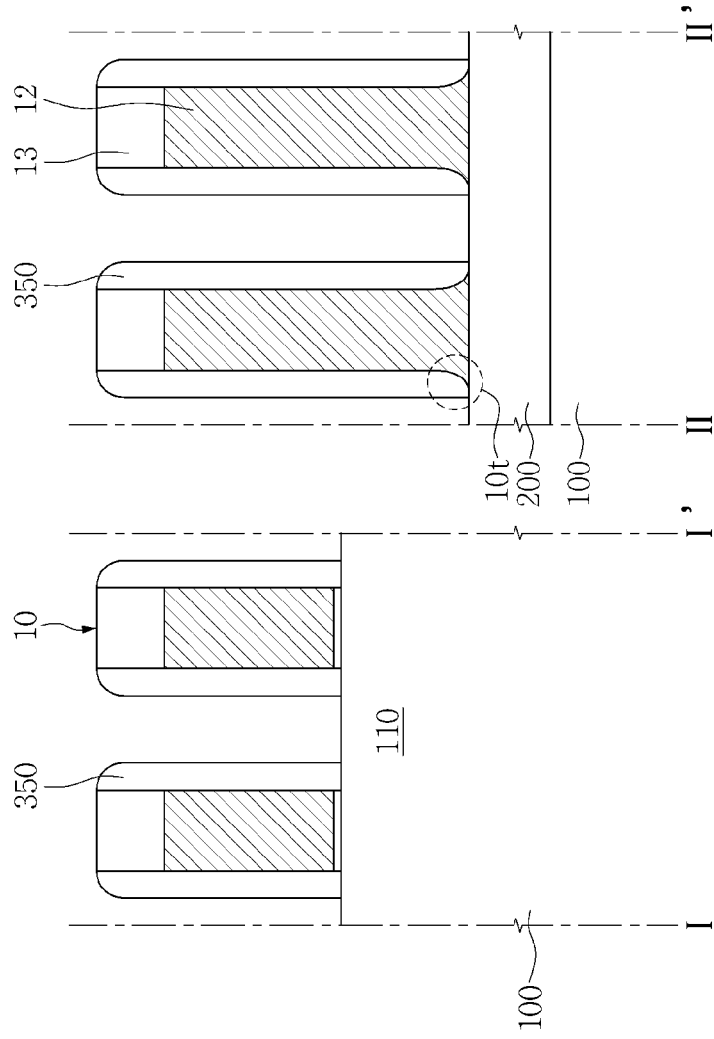

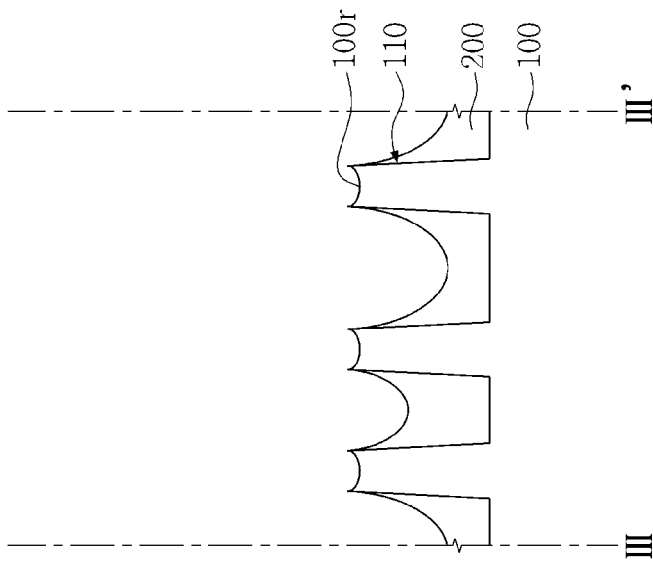
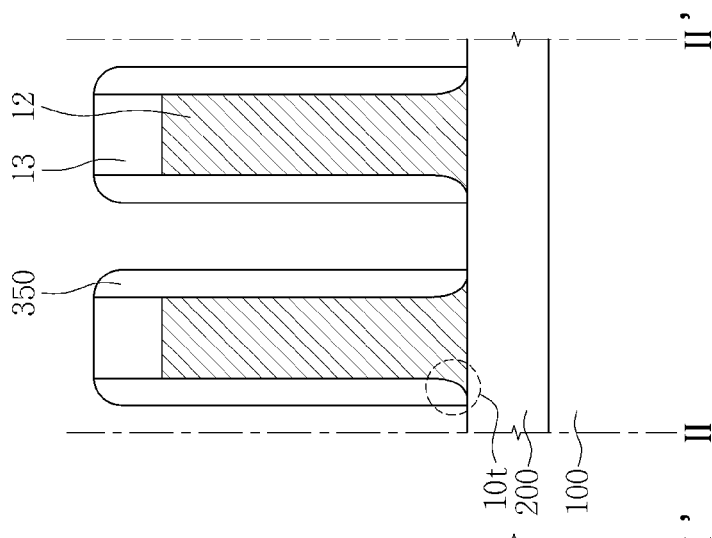
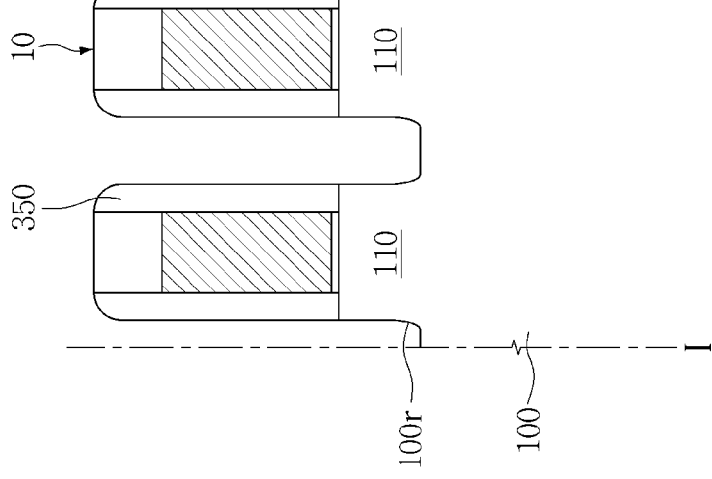

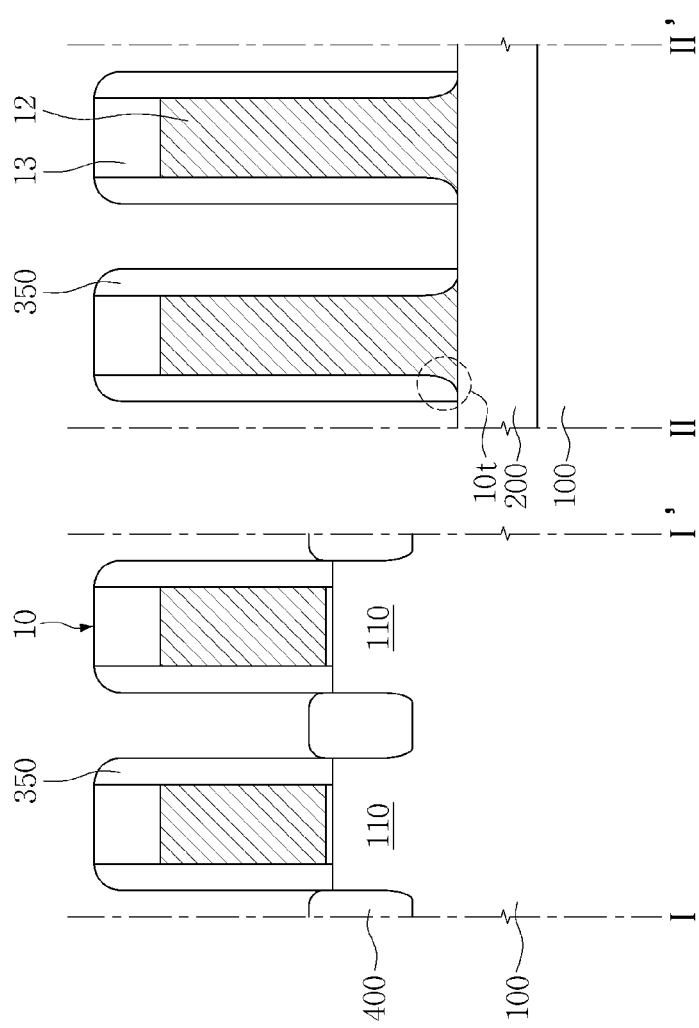

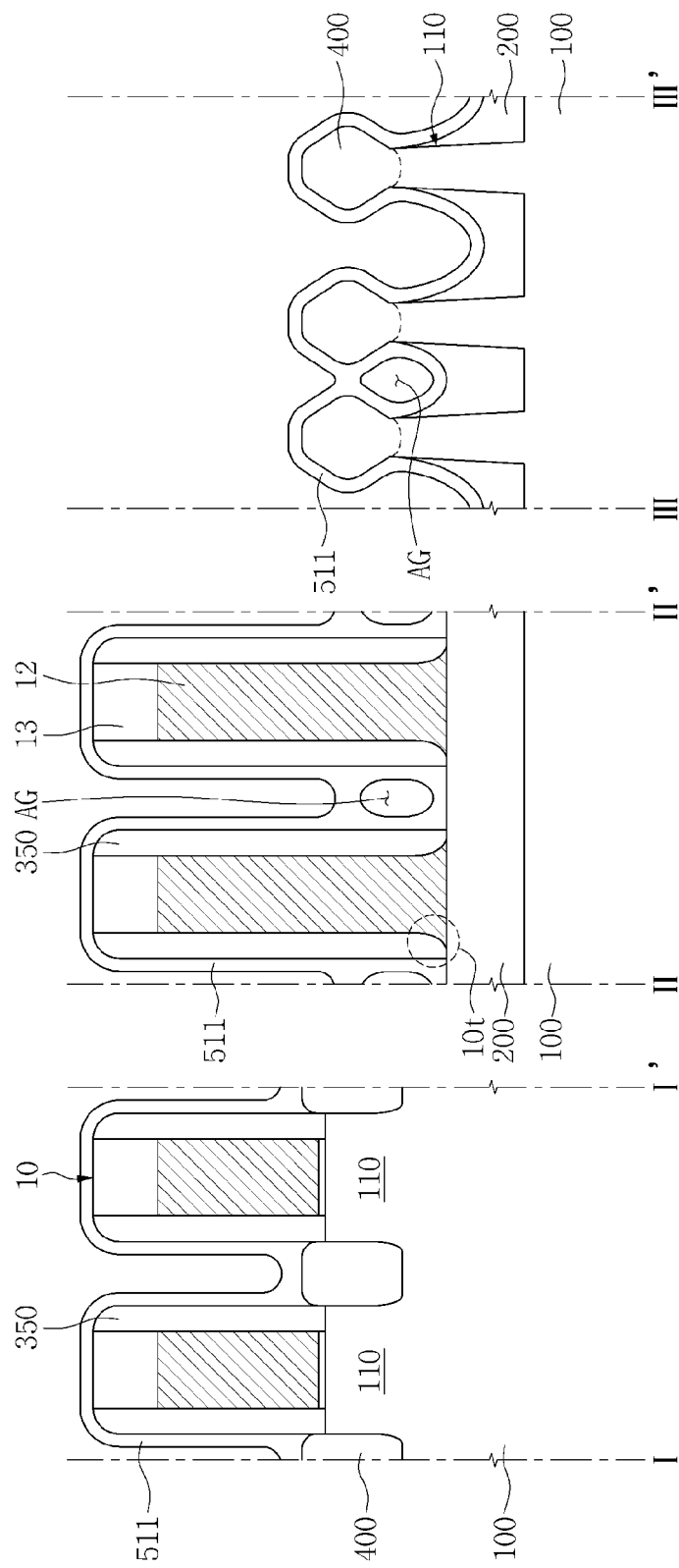

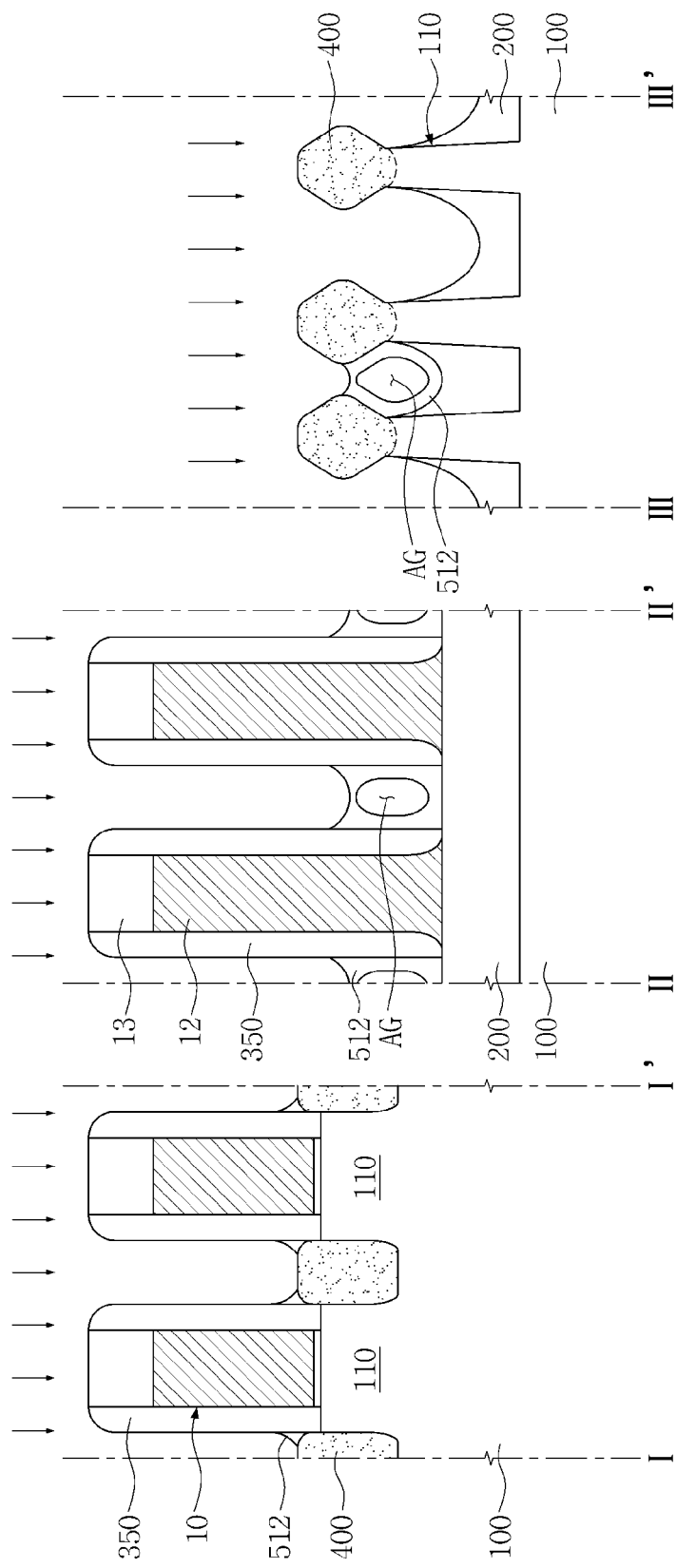

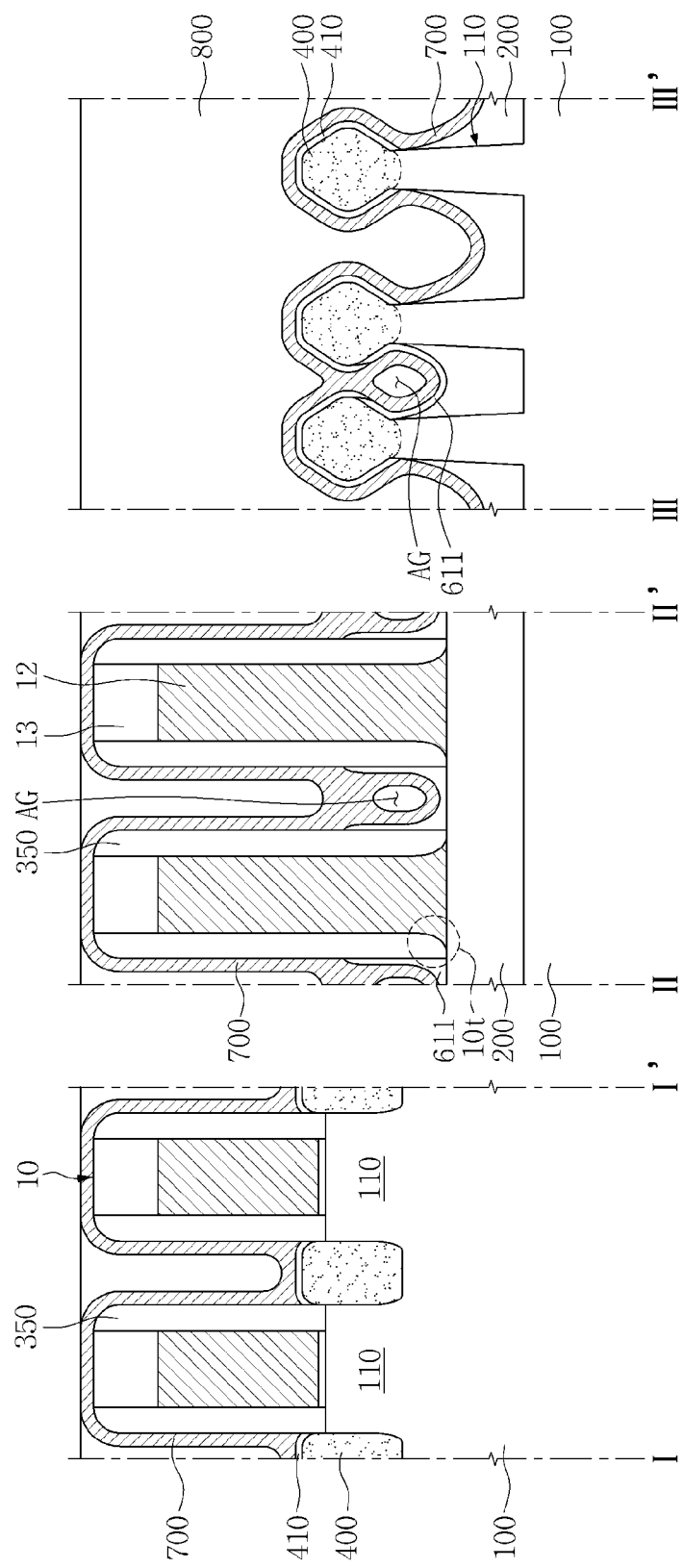

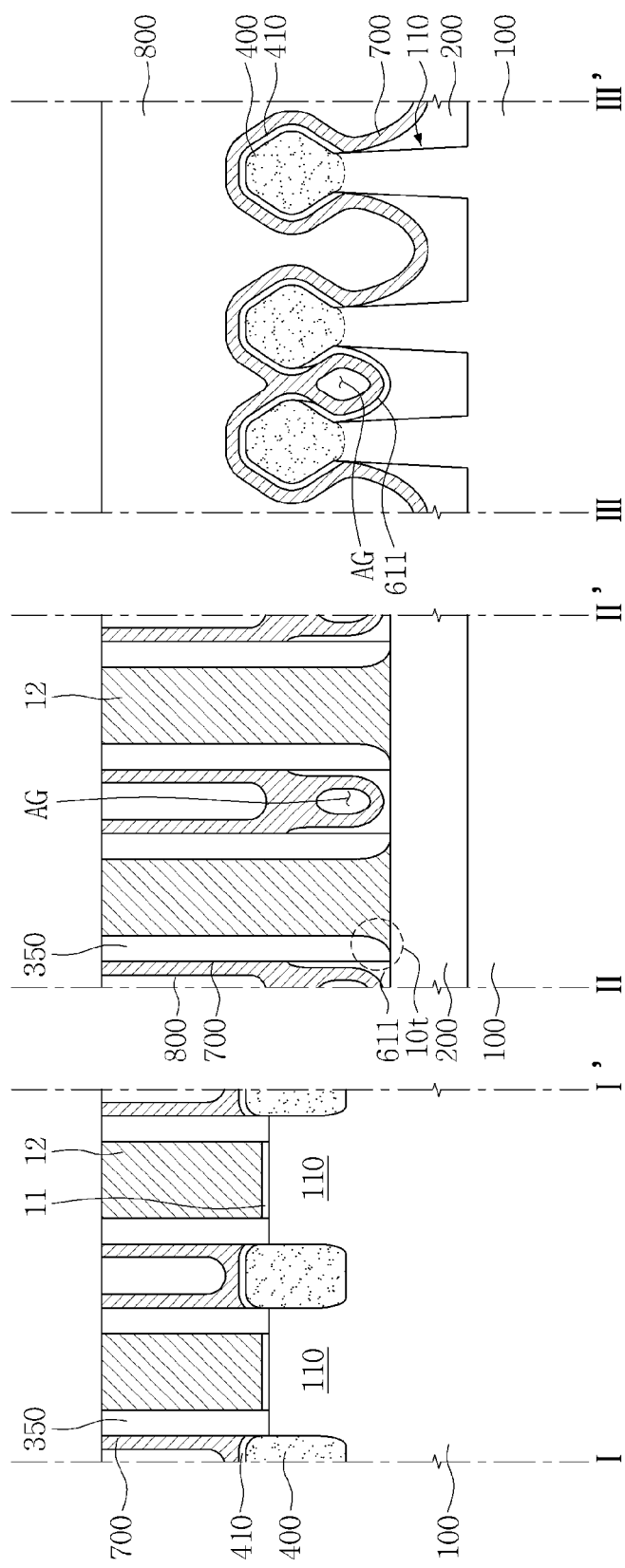

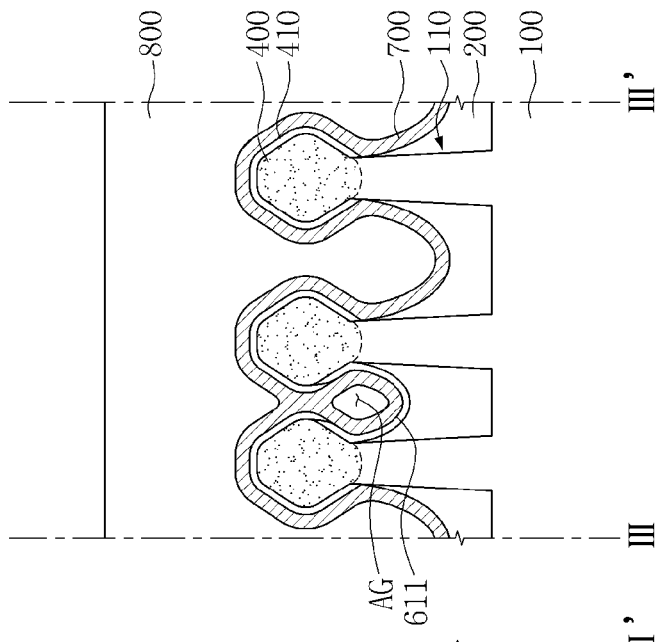
FIG. 19A  FIG. 19B  FIG. 19C
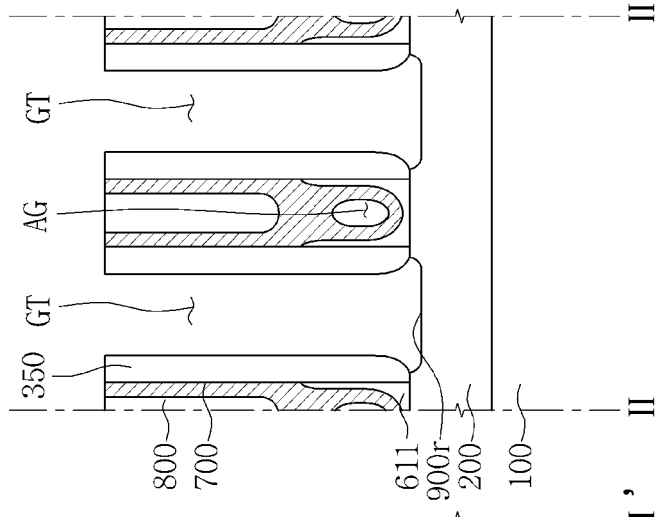
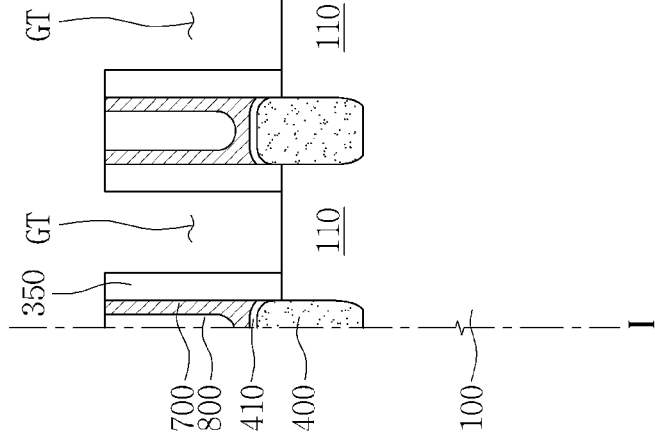

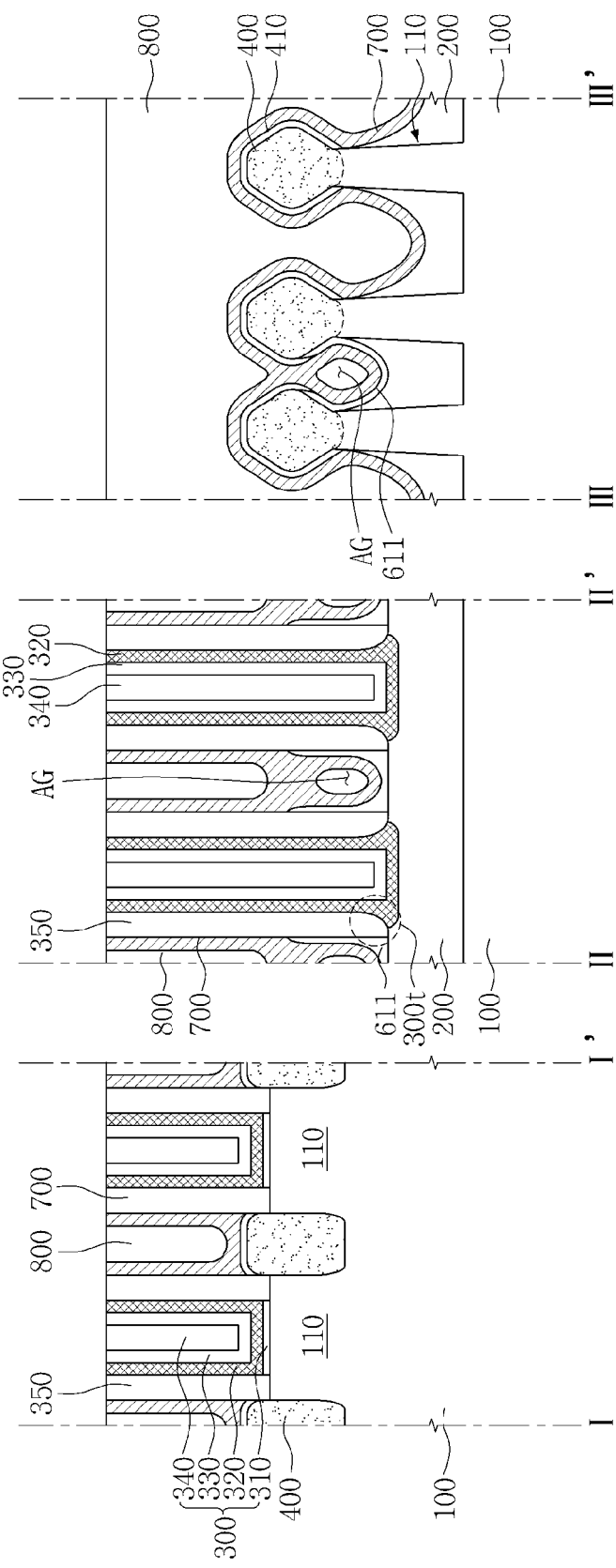

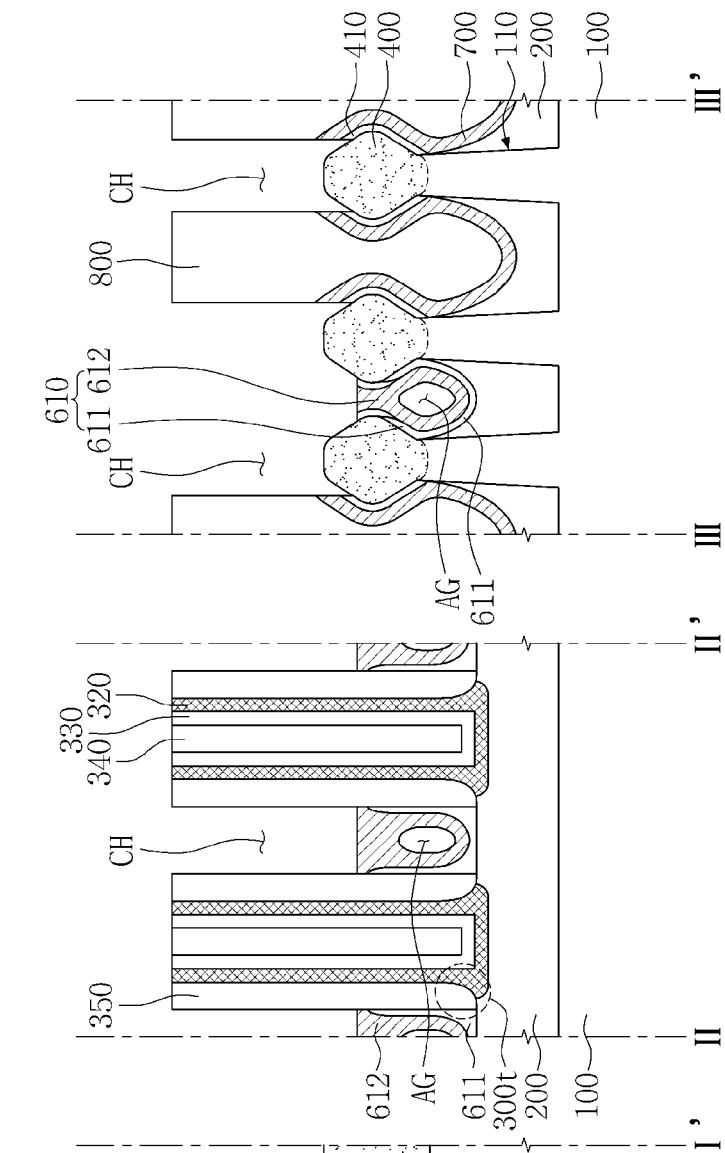

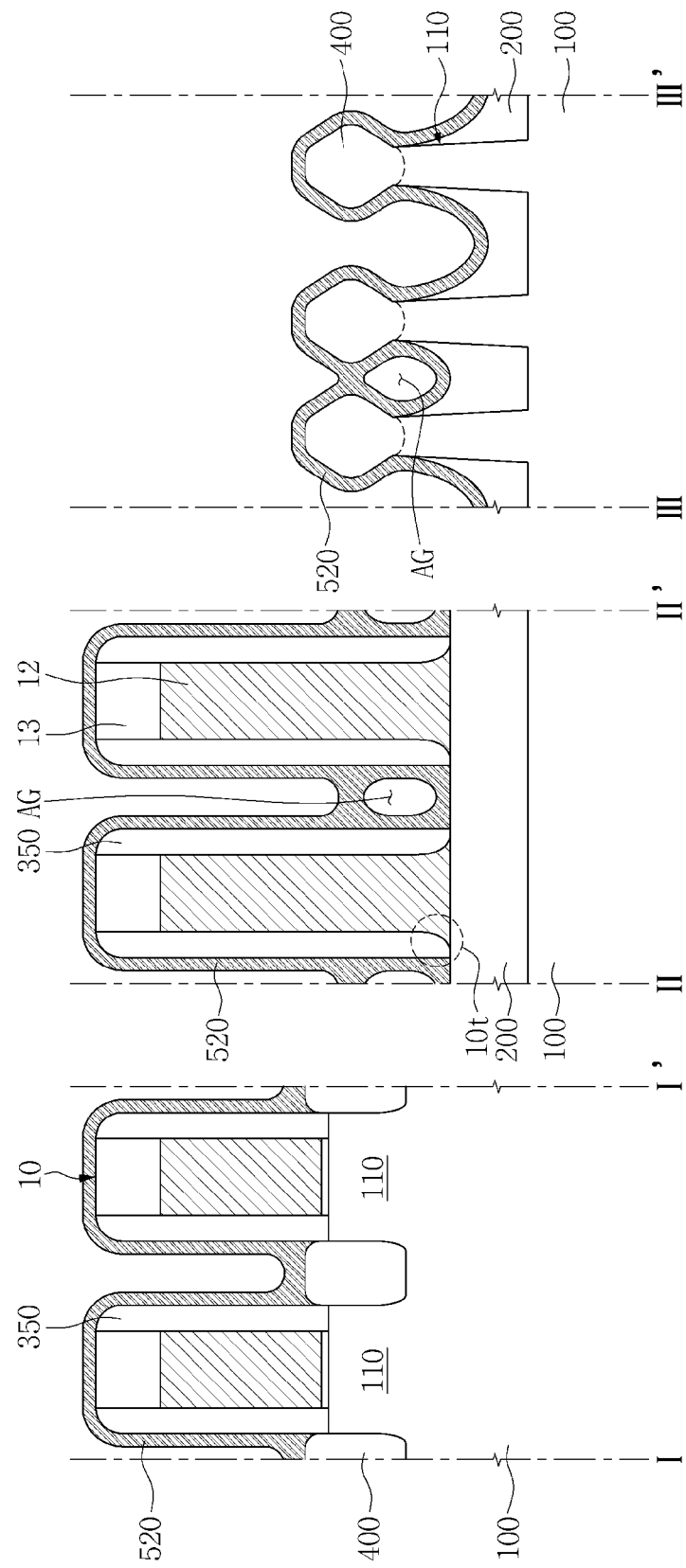

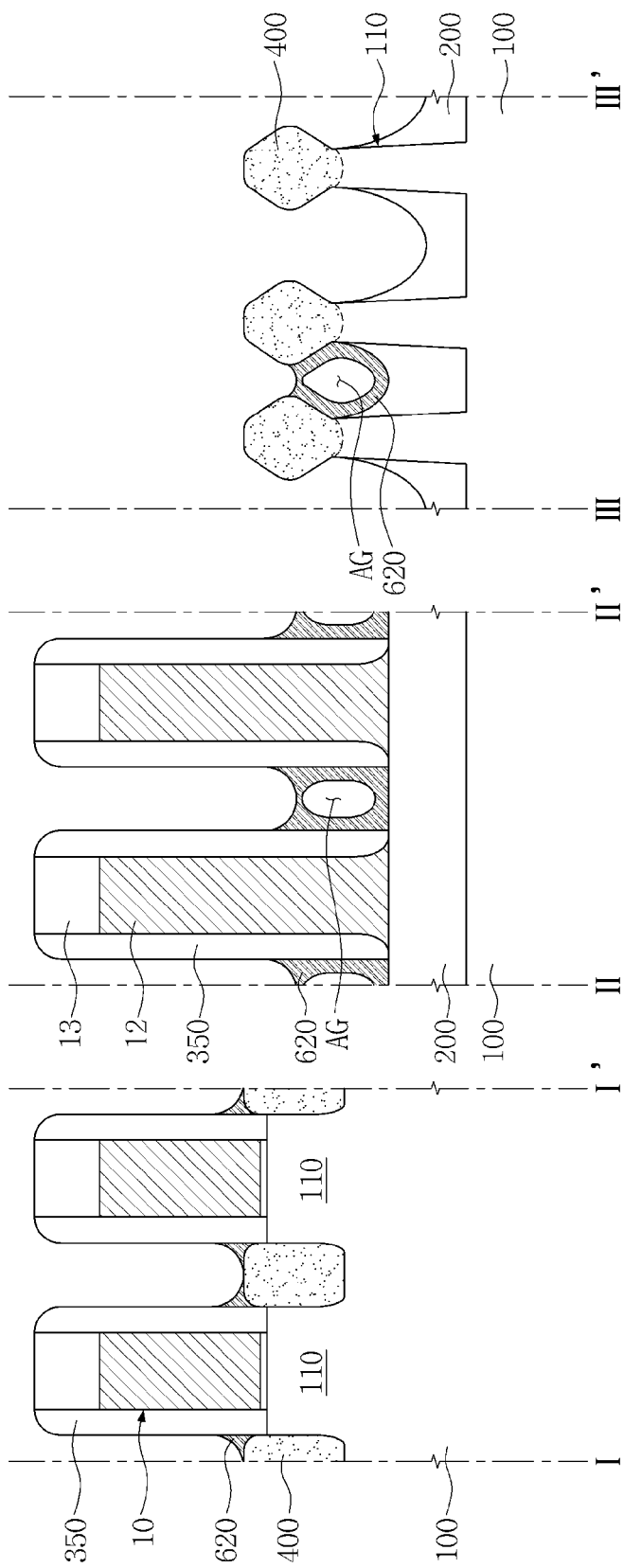

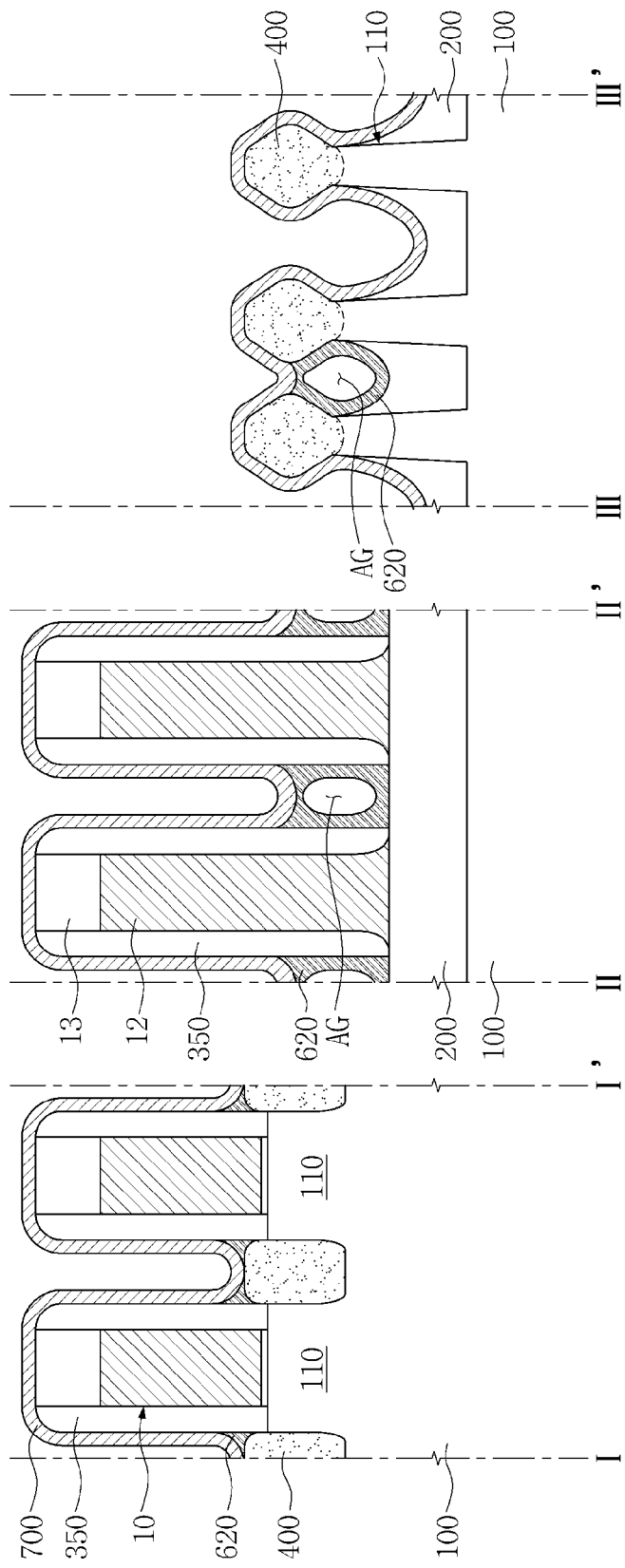

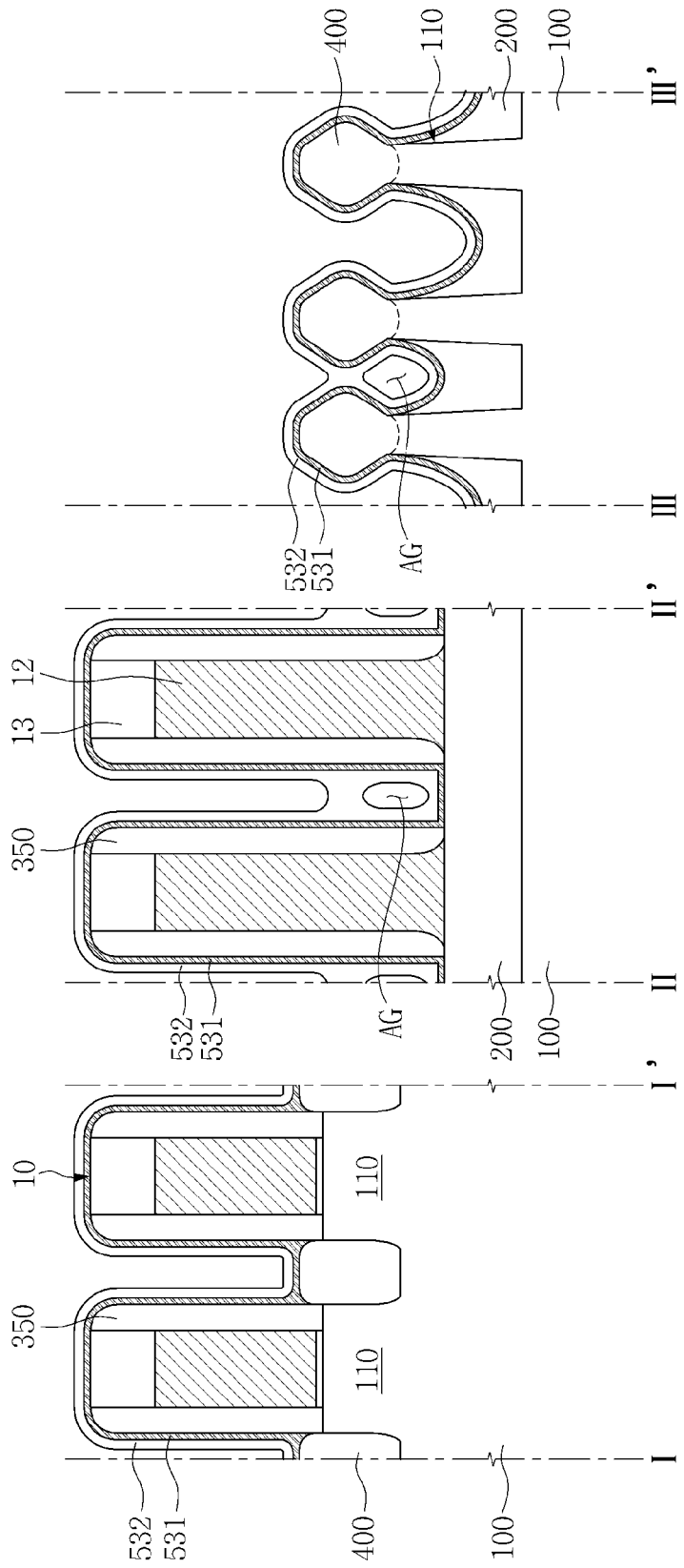

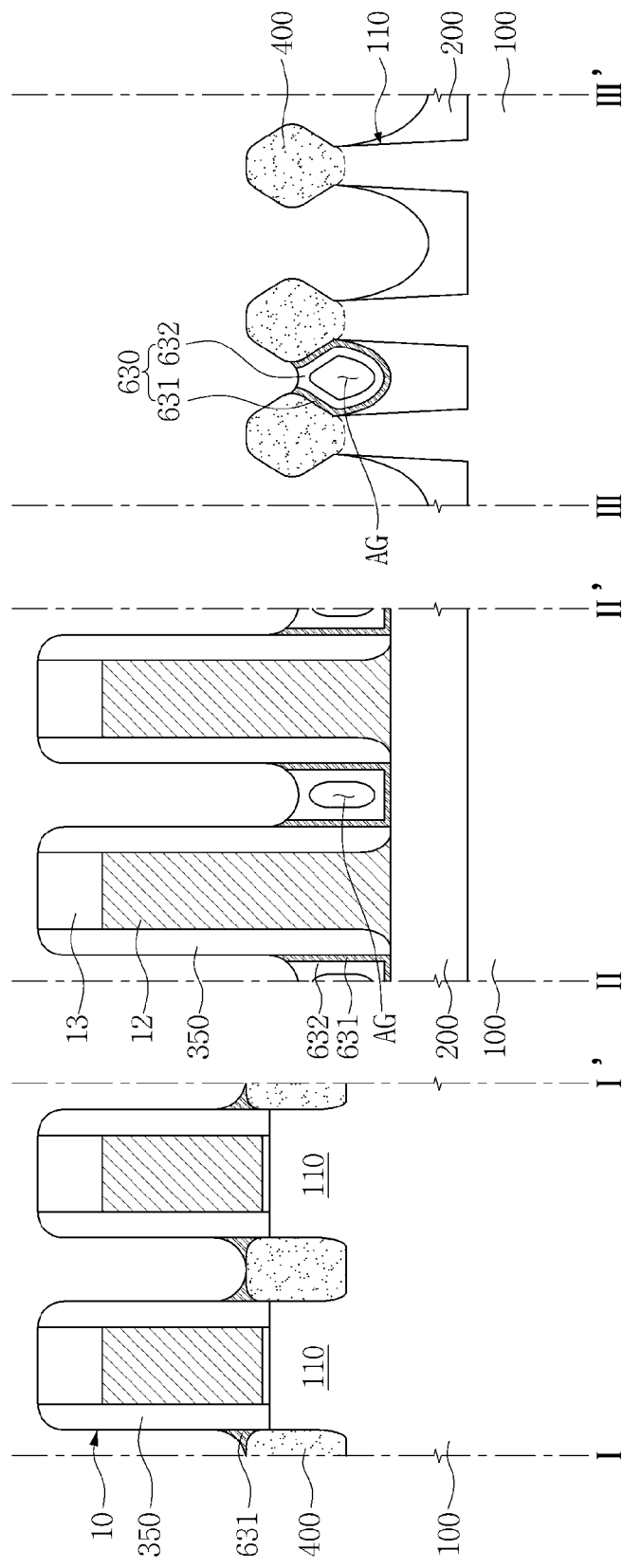

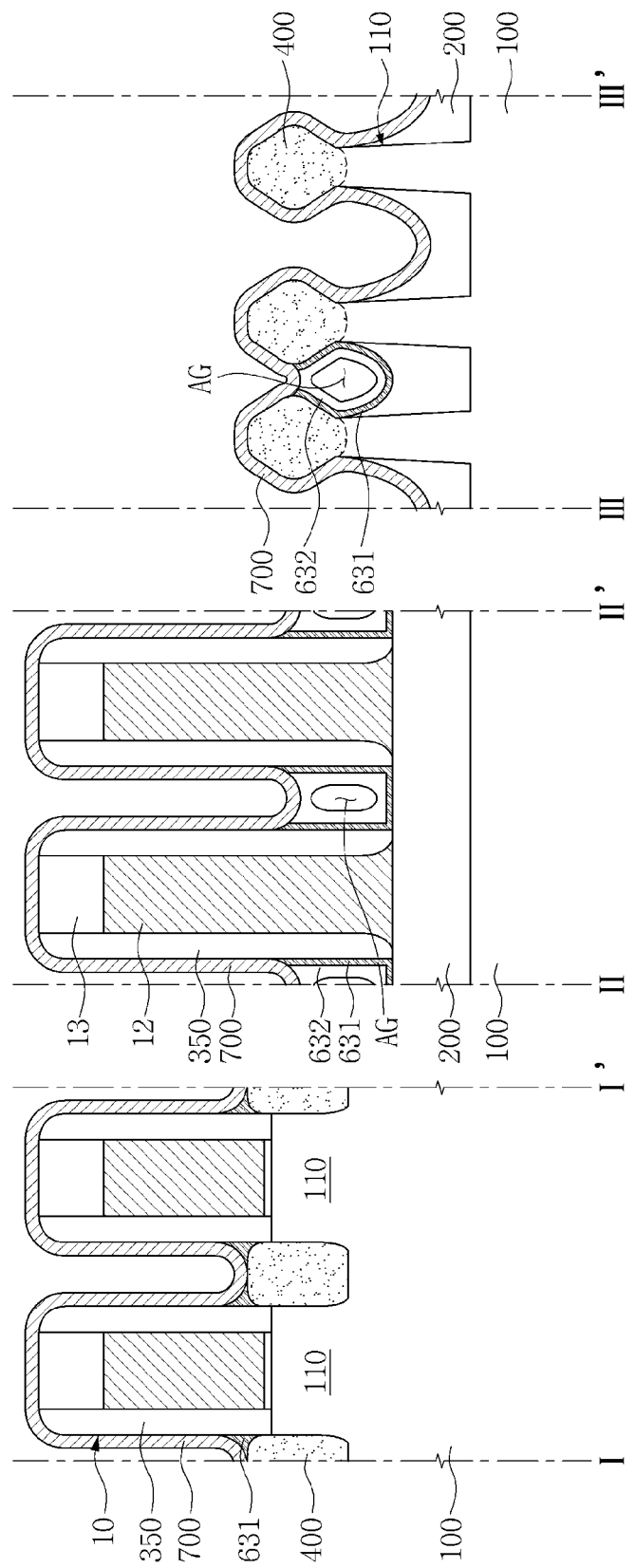

SEMICONDUCTOR DEVICE BLOCKING LEAKAGE CURRENT AND METHOD OF FORMING THE SAME

CROSS-REFERENCE TO RELATED APPLICATIONS

This application claims priority under 35 U.S.C. §119 to Korean Patent Application No. 10-2015-0080591 filed on Jun. 8, 2015, the disclosure of which is hereby incorporated by reference in its entirety.

TECHNICAL FIELD

Exemplary embodiments of the inventive concept relate to a semiconductor device capable of blocking a leakage current between a gate assembly and an epitaxial region, and a method of forming the same.

DISCUSSION OF THE RELATED ART

Semiconductor devices such as fin field effect transistors (FinFETs) include fin bodies and device isolation layers disposed between the fin bodies. The semiconductor devices further include gate assemblies perpendicular to the fin bodies and the device isolation layers, gate spacers disposed on side surfaces of the gate assemblies, and epitaxial regions disposed on upper surfaces of the fin bodies between the gate spacers. In the semiconductor devices, a leakage current can occur between the gate assemblies and the epitaxial regions due to step differences between the fin bodies and the device isolation layers.

SUMMARY

Exemplary embodiments of the inventive concept provide a semiconductor device capable of blocking a leakage current.

Exemplary embodiments of the inventive concept provide a semiconductor device capable of preventing an electrical connection between a gate assembly and an epitaxial region, and a method of forming the same.

In accordance with an exemplary embodiment of the inventive concept, a semiconductor device includes a gate assembly disposed on a device isolation layer, a gate spacer disposed on a side surface of the gate assembly, a contact assembly disposed on the gate spacer, an air gap disposed between the device isolation layer and the contact assembly, and a first spacer capping layer disposed between the gate spacer and the air gap. The first spacer capping layer has an etch selectivity with respect to the gate spacer.

The first spacer capping layer may surround the air gap.

The semiconductor device may further include a second spacer capping layer disposed between the gate spacer and the first spacer capping layer.

The second spacer capping layer may have an etch selectivity with respect to the first spacer capping layer.

An uppermost end of the second spacer capping layer may be lower than an uppermost end of the first spacer capping layer.

The second spacer capping layer may extend between the device isolation layer and the first spacer capping layer.

In accordance with an exemplary embodiment of the inventive concept, a semiconductor device includes a substrate including a first fin body and a second fin body spaced apart from the first fin body, a device isolation layer disposed between the first fin body and the second fin body, a gate assembly disposed on the substrate, a gate spacer disposed on a side surface of the gate assembly, an air gap disposed between the first fin body and the second fin body, and a spacer capping layer surrounding the air gap and having an etch selectivity with respect to the gate spacer.

The spacer capping layer may be in contact with the gate spacer.

The semiconductor device may further include a first epitaxial region disposed on the gate spacer and an upper surface of the first fin body, and a second epitaxial region disposed on the gate spacer and an upper surface of the second fin body and spaced apart from the first epitaxial region. The spacer capping layer may extend onto lower side surfaces of the first epitaxial region and the second epitaxial region, and the lower side surfaces of the first and second epitaxial regions may face each other.

The spacer capping layer may be in direct contact with the lower side surfaces of the first epitaxial region and the second epitaxial region.

A space between the first epitaxial region and the second epitaxial region may be filled with the spacer capping layer.

The spacer capping layer may include silicon nitride.

An upper surface of the spacer capping layer may be bowl-shaped.

A lower surface of the gate assembly may be lower than a lower surface of the spacer capping layer.

A lowermost end of the gate spacer may be at substantially the same level as the lower surface of the spacer capping layer.

In accordance with an exemplary embodiment of the inventive concept, a semiconductor device includes a plurality of gate assemblies disposed on a device isolation layer, a plurality of gate spacers disposed on side surfaces of the gate assemblies, a plurality of air gaps disposed between the gate spacers, and a plurality of first spacer capping layers disposed between the gate spacers and the air gaps and having an etch selectivity with respect to the gate spacers. An uppermost end of the first spacer capping layers is at a higher level than an uppermost end of the air gaps.

The first spacer capping layers may extend along an upper surface of the device isolation layer.

Each of the first spacer capping layers between the gate assemblies may be U-shaped.

The semiconductor device may further include a plurality of second spacer capping layers disposed between the air gaps and the first spacer capping layers.

The second spacer capping layers may have an etch selectivity with respect to the first spacer capping layers.

In accordance with an exemplary embodiment of the inventive concept, a method of manufacturing a semiconductor device includes forming a first fin body on a substrate, forming a second fin body spaced apart from the first fin body on the substrate, forming a device isolation layer between the first fin body and the second fin body, forming a first epitaxial region on an upper surface of the first fin body, forming a second epitaxial region on an upper surface of the second fin body and spaced apart from the first epitaxial region, and forming an air gap between lower side surfaces of the first epitaxial region and the second epitaxial region. The lower side surfaces of the first epitaxial region and the second epitaxial region face each other. The method further includes forming an outer spacer capping layer and an inner spacer capping layer between the first and second epitaxial regions. The inner spacer capping layer has an etch selectivity with respect to the outer spacer capping layer, and a distance from the air gap to the outer spacer capping layer is less than a distance from the air gap to the inner spacer capping layer.

BRIEF DESCRIPTION OF THE DRAWINGS

The above and other features of the present inventive concept will become more apparent by describing in detail exemplary embodiments thereof with reference to the accompanying drawings, in which:

FIG. 2A is a cross-sectional view taken along line I-I' of FIG. 1 according to an exemplary embodiment of the inventive concept.

FIG. 2B is a cross-sectional view taken along line II-II' of FIG. 1 according to an exemplary embodiment of the inventive concept.

FIG. 2C is a cross-sectional view taken along line III-III' of FIG. 1 according to an exemplary embodiment of the inventive concept.

FIGS. 3A to 3C are cross-sectional views illustrating a semiconductor device according to an exemplary embodiment of the inventive concept.

FIGS. 4A to 4C are cross-sectional views illustrating a semiconductor device according to an exemplary embodiment of the inventive concept.

FIGS. 5A to 5C are cross-sectional views illustrating a semiconductor device according to an exemplary embodiment of the inventive concept.

FIGS. 6A to 6C are cross-sectional views illustrating a semiconductor device according to an exemplary embodiment of the inventive concept.

FIGS. 7A to 21A, 7B to 21B, and 7C to 21C are cross-sectional views sequentially illustrating a method of forming a semiconductor device according to an exemplary embodiment of the inventive concept.

FIGS. 22A to 25A, 22B to 25B, and 22C to 25C are cross-sectional views sequentially illustrating a method of forming a semiconductor device according to an exemplary embodiment of the inventive concept.

FIGS. 26A to 29A, 26B to 29B, and 26C to 29C are cross-sectional views sequentially showing a method of forming a semiconductor device according to an exemplary embodiment of the inventive concept.

DETAILED DESCRIPTION OF THE EMBODIMENTS

Figure 1:
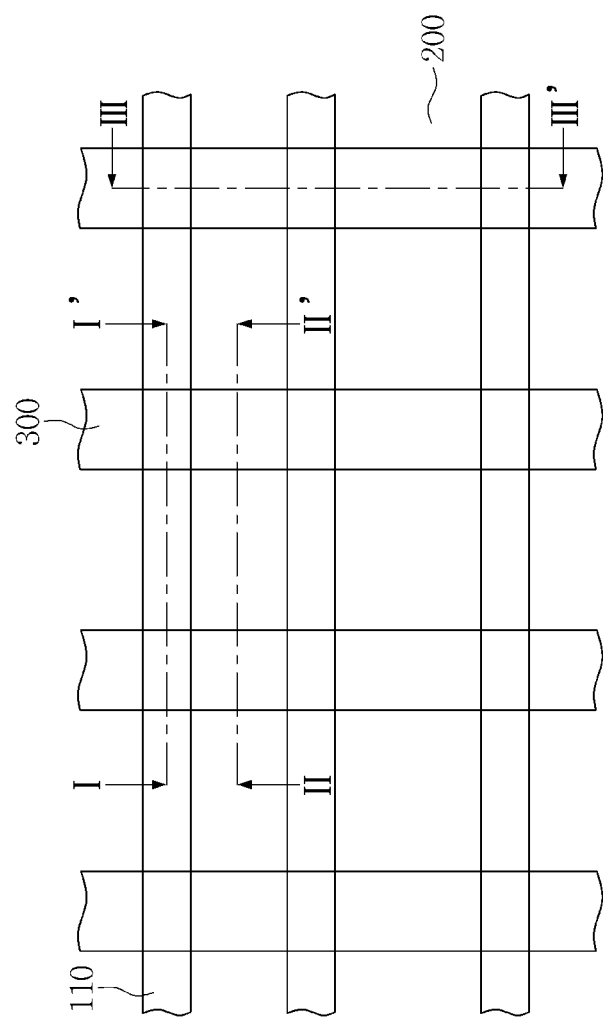
FIG. 1 is a layout view illustrating a semiconductor device according to an exemplary embodiment of the inventive concept.

Exemplary embodiments of the present inventive concept will be described more fully hereinafter with reference to the accompanying drawings. Like reference numerals may refer to like elements throughout the accompanying drawings.

In the drawings, the lengths and thicknesses of layers and regions, and the size and relative sizes of layers and regions, may be exaggerated for clarity. In addition, it will be understood that when a first element is referred to as being "on" a second element, the first element may be directly on the second element, or a third element may be interposed between the first element and the second element.

It will be understood that the terms "first," "second," etc. may be used herein to distinguish one element from another, and the elements are not limited by these terms. Thus, a "first" element in an exemplary embodiment may be described as a "second" element in another exemplary embodiment.

The terminology used herein is for the purpose of describing particular exemplary embodiments only and is not intended to be limiting of the present inventive concept. As used herein, the singular forms "a," "an," "the," etc. are intended to include the plural forms as well, unless the context clearly indicates otherwise.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, when two directions are described as being substantially parallel or perpendicular to each other, it is to be understood that the two directions are exactly parallel or perpendicular to each other, or are approximately parallel or perpendicular to each other as would be understood by a person having ordinary skill in the art. Further, when processes are described as being performed at substantially the same time, it is to be understood that the processes may be performed at exactly the same time or at about the same time as would be understood by a person having ordinary skill in the art.

Herein, when a first element or layer is described as surrounding a second element or layer, it is to be understood that the first element or layer may entirely surround the second element or layer or may partially surround the second element or layer, as indicated by the context (including the figures).

Herein, when a first layer or element is described as having an etch selectivity with respect to a second layer or element, it is understood that the etch rates of the two elements are related to each other such that the layers are not etched in the same manner during an etching process. For example, a first layer or element having an etch selectivity with respect to a second layer or element may not be etched while the second layer or element is being etched, or may be at etched at a different speed/rate than the second layer or element.

Figure 2D:
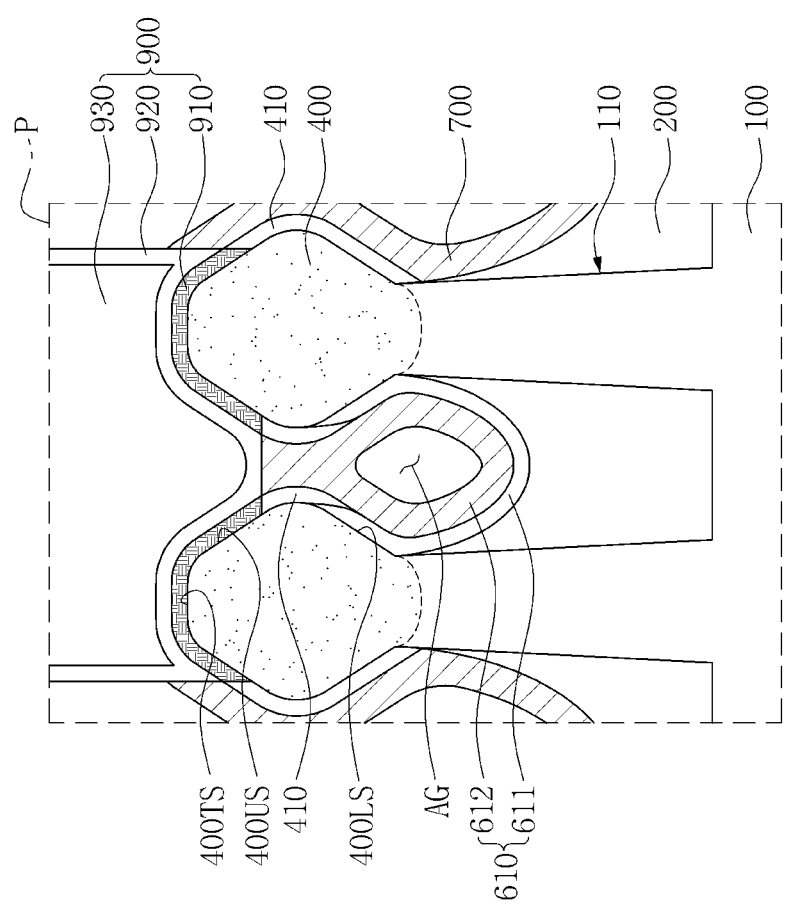
FIG. 2D is an enlarged view of area P shown in FIG. 2C according to an exemplary embodiment of the inventive concept.

FIG. 1 is a layout view illustrating a semiconductor device according to an exemplary embodiment of the inventive concept. FIG. 2A is a cross-sectional view taken along line I-I' of FIG. 1 according to an exemplary embodiment of the inventive concept. FIG. 2B is a cross-sectional view taken along line II-II' of FIG. 1 according to an exemplary embodiment of the inventive concept. FIG. 2C is a cross-sectional view taken along line III-III' of FIG. 1 according to an exemplary embodiment of the inventive concept. FIG. 2D is an enlarged view of area P shown in FIG. 2C according to an exemplary embodiment of the inventive concept. In addition, lines I-I', II-II' and III-III' as shown in other figures herein correspond to cross-sectional views taken along lines I-I', II-II' and III-III' of FIG. 1 according to exemplary embodiments of the inventive concept.

Referring to FIGS. 1 and 2A to 2D, the semiconductor device according an exemplary embodiment may include a substrate 100, device isolation layers 200, gate assemblies 300, gate spacers 350, epitaxial regions 400, spacer capping layers 610, a stopper 700, an interlayer insulating layer 800, and contact assemblies 900.

The substrate 100 may include a semiconductor wafer. For example, the substrate 100 may include a single crystalline silicon wafer, a silicon-on-insulator (SOI) or a silicon wafer including a silicon germanium layer. However, the substrate 100 is not limited thereto.

The substrate 100 may include fin bodies 110. The fin bodies 110 may be formed to protrude from the substrate 100. The fin bodies 110 may extend in a direction away from the substrate 100 to protrude from the substrate 100. The fin bodies 110 may be substantially parallel to each other. In an exemplary embodiment, distances between adjacent fin bodies 110 may be different. In an exemplary embodiment, distances between adjacent fin bodies 110 may be constant.

The device isolation layers 200 may be disposed between the fin bodies 110. The device isolation layers 200 may extend in the same direction as the fin bodies 110. The device isolation layers 200 may cover side surfaces of the fin bodies 110.

The device isolation layers 200 may include an insulating material. For example, the device isolation layers 200 may include silicon oxide (SiO). However, the device isolation layers 200 are not limited thereto.

The gate assemblies 300 may be disposed on the substrate 100. The gate assemblies 300 may extend in a direction away from the substrate 100. For example, the gate assemblies 300 may substantially perpendicularly cross the fin bodies 110 and the device isolation layers 200. The gate assemblies 300 may be substantially parallel with one another. In an exemplary embodiment, distances between adjacent gate assemblies 300 may be constant. In an exemplary embodiment, distances between adjacent gate assemblies may be different.

Each of the gate assemblies 300 may include, for example, an interface insulating layer 310, a gate insulating layer 320, a gate barrier layer 330, and a gate electrode 340.

In an exemplary embodiment, the interface insulating layer 310 may be disposed close to the fin bodies 110. For example, in an exemplary embodiment, the interface insulating layer 310 may be disposed on surfaces of the fin bodies 110. In an exemplary embodiment, the interface insulating layer 310 may be in direct contact with the fin bodies 110.

The interface insulating layer 310 may include an insulating material. For example, the interface insulating layer 310 may be a natural oxide layer formed by oxidizing the surfaces of the fin bodies 110. However, the interface insulating layer 310 is not limited thereto.

The gate insulating layer 320 may be disposed on the interface insulating layer 310. The gate insulating layer 320 may extend onto the device isolation layers 200. The interface insulating layer 310 may be disposed between the fin bodies 110 and the gate insulating layer 320.

The gate insulating layer 320 may include an insulating material. The gate insulating layer 320 may have a high-k dielectric constant. For example, the gate insulating layer 320 may include a metal oxide such as hafnium oxide (HfO), aluminum oxide (AlO), titanium oxide (TiO), etc. However, the gate insulating layer 320 is not limited thereto.

The gate barrier layer 330 may be disposed on the gate insulating layer 320. The gate barrier layer 330 may include a barrier material. For example, the gate barrier layer 330 may include titanium (Ti), titanium nitride (TiN), tantalum (Ta), or tantalum nitride (TaN). However, the gate barrier layer 330 is not limited thereto.

The gate electrode 340 may be disposed on the gate barrier layer 330. The gate electrode 340 may include a conductive material. For example, the gate electrode 340 may include a metal, such as tungsten (W), copper (Cu), titanium (Ti), etc., or a metallic compound. However, the gate electrode 340 is not limited thereto.

The gate assemblies 300 may include gate tail regions 300t on the device isolation layers 200. The gate tail regions 300t may be formed to protrude from side surfaces of the gate assemblies 300, as shown in FIG. 2B. The gate tail regions 300t may be disposed on lowermost ends of the gate assemblies 300, as shown in FIG. 2B.

The gate spacers 350 may be disposed on side surfaces of the gate assemblies 300. The gate spacers 350 may extend along the gate assemblies 300, for example, in a lengthwise direction. For example, the gate spacers 350 may substantially perpendicularly cross the fin bodies 110 and the device isolation layers 200.

The gate spacers 350 may cover the gate tail regions 300t on the device isolation layers 200, as shown in FIG. 2B. Thicknesses of the gate spacers 350 may be relatively thin on the gate tail regions 300t.

Lowermost ends of the gate spacers 350 may be at higher levels (e.g., may have greater heights) than lower surfaces of the gate assemblies 300 on the device isolation layers 200. Lowermost ends of the gate spacers 350 on the device isolation layers 200 may be at substantially the same level as upper surfaces of the device isolation layers 200. Lower surfaces of the gate assemblies 300 on the device isolation layers 200 may be at lower levels (e.g., may have lower heights) than upper surfaces of the device isolation layers 200.

The gate spacers 350 may include an insulating material. The gate spacers 350 may include carbon. For example, the gate spacers 350 may include silicon carbon oxynitride (SiCON). However, the gate spacers 350 are not limited thereto.

Air gaps AG may be disposed between the gate spacers 350. The air gaps AG may be disposed between the adjacent fin bodies 110. The air gaps AG may be disposed above the device isolation layers 200.

The epitaxial regions 400 may be disposed between the gate spacers 350. The epitaxial regions 400 may be disposed on upper surfaces of the fin bodies 110. Upper surfaces of the fin bodies 110 between the gate spacers 350 may be at lower levels than upper surfaces of the fin bodies 110 under the gate assemblies 300. Lower surfaces of the epitaxial regions 400 may be at lower levels than lower surfaces of the gate assemblies 300 on the fin bodies 110. The epitaxial regions 400 may serve as, for example, source/drain regions.

The epitaxial regions 400 may include an epitaxial growth material. For example, the epitaxial regions 400 may include epitaxial growth silicon (Si), silicon germanium (SiGe), or silicon carbide (SiC). The epitaxial regions 400 may further include a dopant. For example, the epitaxial regions 400 may include phosphorous (P), arsenic (As), or boron (B). However, the epitaxial regions 400 are not limited thereto.

The epitaxial regions 400 may be spaced apart from one another. Each of the epitaxial regions 400 may include a lower side surface 400LS, an upper side surface 400US, and an upper surface 400TS. The upper side surface 400US may be disposed between the lower side surface 400LS and the upper surface 400TS. The slope of the upper side surface 400US may be opposite to the slope of the lower side surface 400LS. For example, the lower side surfaces 400LS of the epitaxial regions 400 may be directed toward the device isolation layers 200.

Lower side surfaces 400LS of the adjacent epitaxial regions 400 facing each other may be directed toward the air gaps AG. The air gaps AG may be disposed between the adjacent fin bodies 110, the device isolation layers 200, the gate spacers 350 and the lower side surfaces 400LS of the adjacent epitaxial regions 400.

Epitaxial oxide layers 410 may be disposed on surfaces of the epitaxial regions 400. The epitaxial oxide layers 410 may be, for example, natural oxide layers formed by oxidizing the surfaces of the epitaxial regions 400. However, the epitaxial oxide layers 410 are not limited thereto.

The spacer capping layers 610 may be disposed between the gate spacers 350 and the air gaps AG. The spacer capping layers 610 may surround the air gaps AG. For example, the spacer capping layers 610 may be disposed between the fin bodies 110, the device isolation layers 200, the gate spacers 350 and the epitaxial regions 400, and the air gaps AG. Spaces between the adjacent epitaxial regions 400 may be filled by the spacer capping layers 610.

The spacer capping layers 610 may each include an inner spacer capping layer 611 (e.g., a second spacer capping layer) and an outer spacer capping layer 612 (e.g., a first spacer capping layer).

In an exemplary embodiment, the inner spacer capping layer 611 may be in direct contact with the fin bodies 110, the device isolation layers 200, and the gate spacers 350. The inner spacer capping layer 611 may extend onto the lower side surfaces 400LS of the adjacent epitaxial regions 400 facing each other. The inner spacer capping layer 611 may be in direct contact with the lower side surfaces 400LS of the epitaxial regions 400.

In an exemplary embodiment, the inner spacer capping layer 611 may not fill a space between the adjacent epitaxial regions 400. For example, the inner spacer capping layer 611 on the side surfaces 400LS of the adjacent epitaxial regions 400 may be spaced apart from each other. For example, in an exemplary embodiment, the inner spacer capping layer 611 between the gate spacers 350 and on the device isolation layers 200 may be U-shaped.

The outer spacer capping layer 612 may be disposed on the inner spacer capping layer 611. The outer spacer capping layer 612 may be disposed close to the corresponding air gap AG. The outer spacer capping layer 612 may be disposed between the corresponding air gap AG and the inner spacer capping layer 611. The inner spacer capping layer 611 may extend between the outer spacer capping layer 612 and the corresponding device isolation layer 200 and between the adjacent gate spacers 350. The outer spacer capping layer 612 is disposed closer to the corresponding air gap AG than the inner spacer capping layer 611. That is, a distance from the air gap AG to the outer spacer capping layer 612 is less than a distance from the air gap AG to the inner spacer capping layer 611.

The air gaps AG may be surrounded by the outer spacer capping layer 612 of the corresponding spacer capping layer 610. An uppermost end of the outer spacer capping layer 612 may be at a higher level than an uppermost end of the inner spacer capping layer 611. A space between the adjacent epitaxial regions 400 may be blocked by the outer spacer capping layer 612. The outer spacer capping layer 612 may fill the space between the adjacent epitaxial regions 400. The uppermost end of the outer spacer capping layer 612 may be disposed on the upper side surfaces 400US of the epitaxial regions 400.

The inner spacer capping layer 611 and the outer spacer capping layer 612 may include an insulating material. The outer spacer capping layer 612 may have an etch selectivity with respect to the gate spacers 350. For example, the outer spacer capping layer 612 may include silicon nitride (SiN). The inner spacer capping layer 611 may have an etch selectivity with respect to the outer spacer capping layer 612. For example, the inner spacer capping layer 611 may include silicon oxide (SiO). However, the outer spacing capping layer 612 and the inner spacer capping layer 611 are not limited thereto.

The semiconductor device according to an exemplary embodiment of the inventive concept has been described herein as having the inner spacer capping layer 611 that has an etch selectivity with respect to the outer spacer capping layer 612. However, exemplary embodiments of the inventive concept are not limited thereto. For example, in an exemplary embodiment, the inner spacer capping layer 611 may have an etch selectivity with respect to the gate spacer 350. In an exemplary embodiment of the inventive concept, both the inner spacer capping layer 611 and the outer spacer capping layer 612 may include, for example, silicon nitride (SiN).

The semiconductor device according to an exemplary embodiment of the inventive concept may have the spacer capping layer 610 disposed between the gate spacer 350 and the air gap AG. The spacer capping layer 610 may include the outer spacer capping layer 612 having an etch selectivity with respect to the gate spacer 350. Accordingly, in the semiconductor device according to an exemplary embodiment of the inventive concept, an electrical connection between the gate assembly 300 and the epitaxial region 400 caused by a damaged area of the gate spacer 350 can be prevented. Therefore, in the semiconductor device according to an embodiment of the inventive concept, a leakage current between the gate assembly 300 and the epitaxial region 400 may be blocked (e.g., reduced or prevented).

The stopper 700 may be disposed on the device isolation layers 200. The stopper 700 may be disposed between the epitaxial regions 400. The stopper 700 may be disposed on the epitaxial oxide layer 410. The stopper 700 may include an insulating material. For example, the stopper 700 may include silicon nitride (SiN). However, the stopper 700 is not limited thereto.

The interlayer insulating layer 800 may be disposed on the stopper 700. The interlayer insulating layer 800 may include an insulating material. The interlayer insulating layer 800 may have an etch selectivity with respect to the stopper 700. For example, the interlayer insulating layer 800 may include silicon oxide (SiO). However, the interlayer insulating layer 800 is not limited thereto.

The contact assemblies 900 may be disposed on upper surfaces 400TS of the epitaxial regions 400. The contact assemblies 900 may pass through the stopper 700 and the interlayer insulating layer 800. The contact assemblies 900 may be in direct contact with the epitaxial regions 400.

The contact assemblies 900 may connect between the adjacent epitaxial regions 400. The contact assemblies 900 for connecting between the adjacent epitaxial regions 400 may be in direct contact with the spacer capping layers 610.

The contact assemblies 900 may include, for example, a silicide layer 910, a contact barrier layer 920, and a contact plug 930.

The silicide layer 910 may be directly formed on surfaces of the epitaxial regions 400. The silicide layer 910 may include a metal silicide. For example, the silicide layer 910 may include tungsten silicide, nickel silicide, titanium silicide, or cobalt silicide. However, the silicide layer 910 is not limited thereto.

The contact barrier layer 920 may be disposed on the silicide layer 910. The contact barrier layer 920 may include a barrier metal. For example, the contact barrier layer 920 may include titanium (Ti), titanium nitride (TiN), tantalum (Ta), or tantalum nitride (TaN). However, the contact barrier layer 920 is not limited thereto.

The contact plug 930 may be disposed on the contact barrier layer 920. The contact plug 930 may include a conductive material. For example, the contact plug 930 may include a metal, such as tungsten (W), copper (Cu), titanium (Ti), etc., or a metallic compound. However, the contact plug 930 is not limited thereto.

As a result, in a semiconductor device according to an exemplary embodiment of the inventive concept, an outer spacer capping layer 632 may be disposed between a gate spacer 350 and an air gap AG on a device isolation layer 200. The outer spacer capping layer 632 may have an etch selectivity with respect to the gate spacer 350. Accordingly, in the semiconductor device according to an exemplary embodiment of the inventive concept, a leakage current between the gate assembly 300 and the epitaxial region 400 may be blocked (e.g., reduced or prevented). Therefore, a malfunction of the semiconductor device can be prevented and the reliability thereof can be improved according to exemplary embodiments of the inventive concept.

The semiconductor device according to the exemplary embodiments of the inventive concept described herein have been described as having a gate spacer 350 that has a single layer. However, as shown in FIGS. 3A to 3C, in a semiconductor according to an exemplary embodiment of the inventive concept, the gate spacer 350 may include an inner gate spacer 351 and an outer gate spacer 352. In an exemplary embodiment, the outer gate spacer 352 may include the same material as the inner gate spacer 351 but at a different composition ratio. For example, in an exemplary embodiment, the inner gate spacer 351 and the outer gate spacer 352 may include silicon carbon oxynitride (SiCON) at different composition ratios.

Alternatively, in an exemplary embodiment, the outer gate spacer 352 may include a different material from the inner gate spacer 351. For example, the outer gate spacer 352 may have an etch selectivity with respect to the inner gate spacer 351.

In the semiconductor device according to an exemplary embodiment of the inventive concept, air gaps AG may be surrounded (e.g., completely surrounded) by outer spacer capping layers 612, as shown, for example, in FIGS. 2A-2D and 3A-3C. However, as shown in FIGS. 4A to 4C, in a semiconductor device according to an exemplary embodiment of the inventive concept, spaces between adjacent epitaxial regions 400 may not be completely filled by outer spacer capping layers 612. For example, an uppermost end of the air gaps AG may be covered by the contact assemblies 900. For example, in an exemplary embodiment, the outer spacer capping layers 612 between gate spacers 350 on device isolation layers 200 may be in U-shaped.

FIGS. 5A to 5C are cross-sectional views illustrating a semiconductor device according to an exemplary embodiment of the inventive concept.

Referring to FIGS. 5A to 5C, the semiconductor device according to an exemplary embodiment of the inventive concept may include a substrate 100, device isolation layers 200, gate assemblies 300, gate spacers 350, epitaxial regions 400, spacer capping layers 620, a stopper 700, an interlayer insulating layer 800, and contact assemblies 900.

The substrate 100 may include fin bodies 110. The gate assemblies 300 may include interface insulating layers 310, gate insulating layers 320, gate barrier layers 330, and gate electrodes 340. The contact assemblies 900 may include silicide layers 910, contact barrier layers 920 and contact plugs 930. The air gaps AG may be disposed between the adjacent fin bodies 110, the device isolation layers 200, the gate spacers 350, and the adjacent epitaxial regions 400.

The spacer capping layers 620 may be disposed between the gate spacers 350 and the air gaps AG. The spacer capping layers 620 may be in direct contact with the gate spacers 350. The spacer capping layers 620 may extend between the device isolation layers 200 and the air gaps AG. The spacer capping layers 620 may be in direct contact with the device isolation layers 200. The spacer capping layers 620 may extend between the epitaxial regions 400 and the air gaps AG. The spacer capping layers 620 may be in direct contact with the adjacent epitaxial regions 400. The air gaps AG may be surrounded by the spacer capping layers 620. Spaces between the adjacent epitaxial regions 400 may be filled with the spacer capping layers 620.

Upper surfaces of the spacer capping layers 620 may be bowl-shaped. Herein, when a surface of a layer is described as being bowl-shaped, the surface may have a concave shape. The spacer capping layers 620 may include an insulating material. The spacer capping layers 620 may have an etch selectivity with respect to the gate spacers 350. For example, the spacer capping layers 620 may include silicon nitride (SiN). However, the spacer capping layers 620 are not limited thereto.

The semiconductor device according to an exemplary embodiment of the inventive concept may further include an upper capping pattern 625 disposed between the spacer capping layer 620 and the contact assembly 900. Spaces between the adjacent epitaxial regions 400 may be filled with the spacer capping layers 620 and the upper capping pattern 625. The upper capping pattern 625 may include an insulating material. For example, the upper capping pattern 625 may include the same material as the stopper 700. The upper capping pattern 625 may include silicon nitride (SiN). However, the upper capping pattern 625 is not limited thereto.

Figures 6A, 6B, 6C:
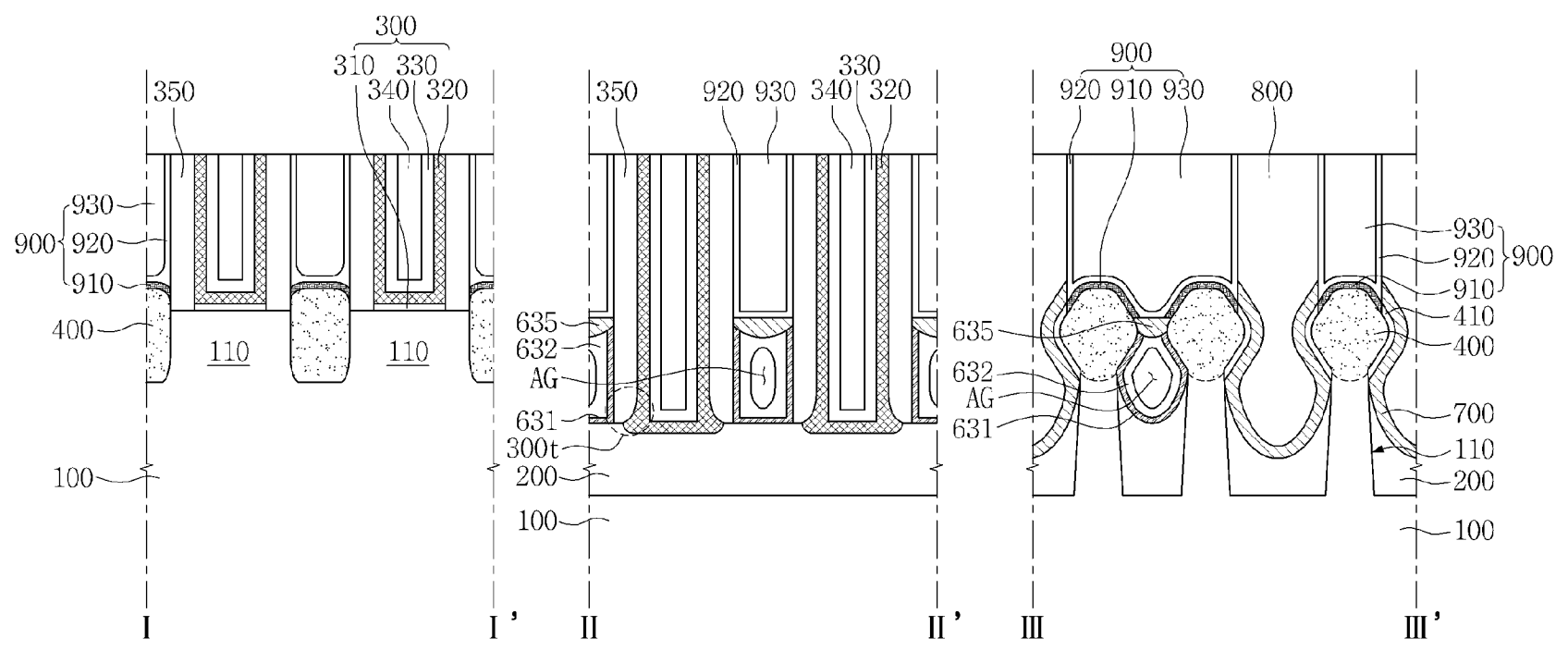

FIGS. 6A to 6C are cross-sectional views illustrating a semiconductor device according to an exemplary embodiment of the inventive concept.

Referring to FIGS. 6A to 6C, the semiconductor device according to an exemplary embodiment of the inventive concept may include a substrate 100 including fin bodies 110, device isolation layers 200 disposed between the fin bodies 110, gate assemblies 300 crossing the fin bodies 110 and the device isolation layers 200, gate spacers 350 disposed on side surfaces of the gate assemblies 300, epitaxial regions 400 disposed on upper surfaces of the fin bodies 110 between the gate spacers 350, the adjacent fin bodies 110, the device isolation layers 200, air gaps AG disposed between the gate spacers 350 and the adjacent epitaxial regions 400, spacer capping layers 631, 632 surrounding the air gaps AG, a stopper 700 disposed on the device isolation layers 200 and the epitaxial regions 400, an interlayer insulating layer 800 disposed on the stopper 700, and contact assemblies 900 electrically connected with the epitaxial regions 400.

Each of the gate assemblies 300 may include an interface insulating layer 310, a gate insulating layer 320, a gate barrier layer 330, and a gate electrode 340. Each of the contact assemblies 900 may include a silicide layer 910, a contact barrier layer 920, and contact plug 930. Spacer capping layers 631 and 632 may respectively be referred to as inner spacer capping layer 631 and outer spacer capping layer 632.

The inner spacer capping layers 631 may be disposed between the gate spacers 350 and the outer spacer capping layers 632. The inner spacer capping layers 631 may be in direct contact with the gate spacers 350. The inner spacer capping layers 631 may extend between the device isolation layers 200 and the outer spacer capping layers 632. The inner spacer capping layers 631 may be in direct contact with the device isolation layers 200. For example, the inner spacer capping layers 631 between the gate spacers 350 and the device isolation layers 200 may be U-shaped.

The inner spacer capping layers 631 may include an insulating material. The inner spacer capping layers 631 may have an etch selectivity with respect to the gate spacers 350. For example, the inner spacer capping layers 631 may include silicon nitride (SiN). However, the inner spacer capping layers 631 are not limited thereto.

The outer spacer capping layers 632 may be disposed close to the air gaps AG. The outer spacer capping layers 632 may be disposed between the inner spacer capping layers 631 and the air gaps AG. For example, the air gaps AG may be surrounded by the outer spacer capping layers 632.

Thicknesses of the outer spacer capping layers 632 may be different from those of the inner spacer capping layers 631. For example, the outer spacer capping layers 632 may be thicker than the inner spacer capping layers 631.

Upper surfaces of the outer spacer capping layers 632 may be connected to upper surfaces of the corresponding inner spacer capping layers 631. The upper surfaces of the inner spacer capping layers 631 and upper surfaces of the outer spacer capping layers 632 may be continuous. The upper surface of the inner spacer capping layer 631 and upper surface of the outer spacer capping layer 632 which are connected may be bowl-shaped.

The outer spacer capping layers 632 may include an insulating material. The outer spacer capping layers 632 may have an etch selectivity with respect to the inner spacer capping layers 631. For example, the outer spacer capping layers 632 may include silicon oxide (SiO). However, the outer spacer capping layers 632 are not limited thereto.

The semiconductor device according to an exemplary embodiment of the inventive concept may further include an upper capping pattern 635 disposed between the spacer capping layer 630 and the contact assembly 900. Spaces between the adjacent epitaxial regions 400 may be filled with the spacer capping layers 630 and the upper capping pattern 635. For example, the upper capping pattern 635 may include silicon nitride (SiN). However, the upper capping pattern 635 is not limited thereto.

Figure 14A:
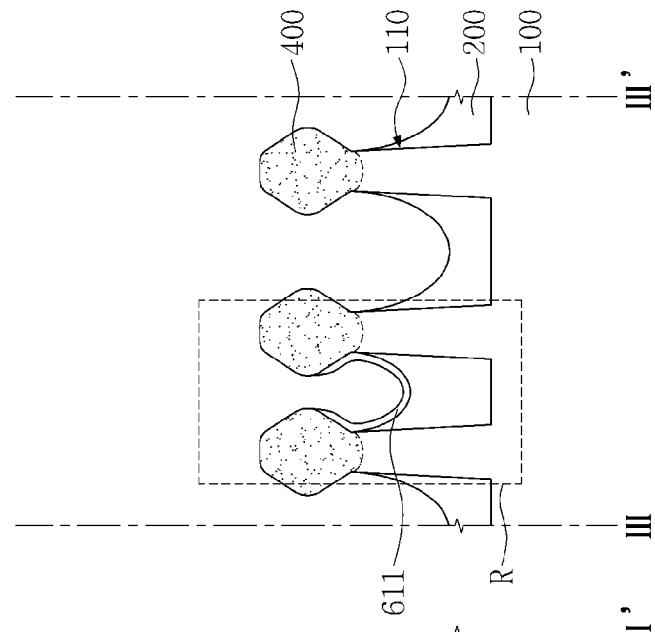
Figure 14B:
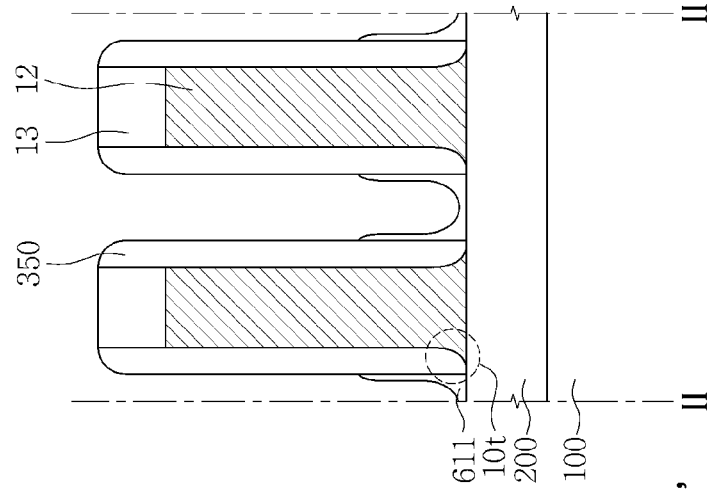
Figure 14C:
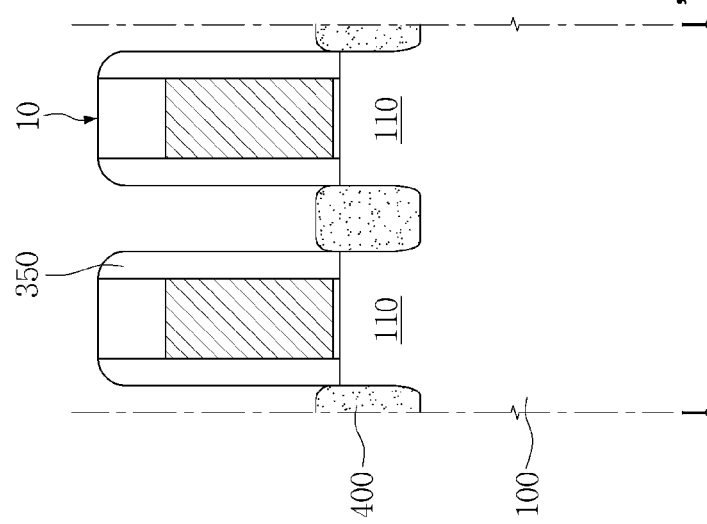
Figure 14D:
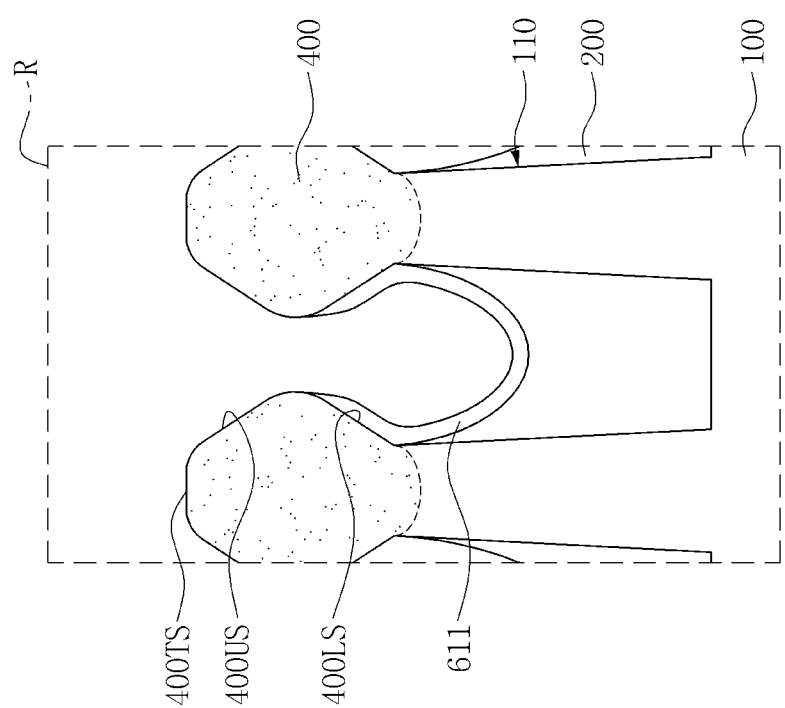
FIG. 14D is an enlarged view of area R shown in FIG. 14C according to an exemplary embodiment of the inventive concept.

FIGS. 7A to 21A, 7B to 21B, and 7C to 21C are cross-sectional views sequentially showing a method of forming a semiconductor device according to an exemplary embodiment of the inventive concept. FIG. 14D is an enlarged view of area R shown in FIG. 14C according to an exemplary embodiment of the inventive concept.

Referring to FIGS. 2A to 2D, 7A to 21A, 7B to 21B, 7C to 21C, and 14D, a method of forming a semiconductor device according to the embodiment of the inventive concept will be described. Referring to FIGS. 7A to 7C, a method of forming a semiconductor device according to an exemplary embodiment of the inventive concept may include a process of preparing a substrate 100 including fin bodies 110, forming device isolation layers 200 between the fin bodies 110, and forming sacrificial gate assemblies 10 substantially perpendicularly crossing the fin bodies 110 and the device isolation layers 200 on the substrate 100.

The process of preparing the substrate 100 including the fin bodies 110 may include a process of forming the fin bodies 110 by etching the substrate 100. The fin bodies 110 may be formed to be substantially parallel to one another. In an exemplary embodiment, distances between the adjacent fin bodies 110 may be different. In an exemplary embodiment, distances between the adjacent fin bodies 110 may be constant.

The device isolation layer 200 may include an insulating material. For example, a process of forming the device isolation layer 200 may include a process of filling between the fin bodies 110 with silicon oxide (SiO). However, the device isolation layer 200 is not limited thereto.

The process of forming the sacrificial gate assemblies 10 may include a process of forming sacrificial gate insulating patterns 11 on the fin bodies 110, a process of forming sacrificial gate electrodes 12 on the sacrificial gate insulating patterns 11 and the device isolation layers 200, and a process of forming sacrificial gate capping patterns 13 on the sacrificial gate electrodes 12. The sacrificial gate assemblies 10 on the fin bodies 110 may each include the sacrificial gate insulating pattern 11, the sacrificial gate electrode 12, and the sacrificial gate capping pattern 13. The sacrificial gate assemblies 10 on the device isolation layers 200 may each include the sacrificial gate electrode 12 and the sacrificial gate capping pattern 13.

The process of forming the sacrificial gate insulating patterns 11, the process of forming the sacrificial gate electrodes 12, and the process of forming the sacrificial gate capping patterns 13 may be performed at substantially the same time. For example, the process of forming the sacrificial gate assemblies 10 may include a process of forming a sacrificial gate insulation layer on the substrate 100 on which the device isolation layers 200 are formed, a process of forming a sacrificial gate electrode layer on the sacrificial gate insulation layer, a process of forming a sacrificial gate capping layer on the sacrificial gate electrode layer, and a process of patterning the sacrificial gate insulation layer, the sacrificial gate electrode layer, and the sacrificial gate capping layer.

The sacrificial gate assemblies 10 on the device isolation layers 200 may include sacrificial tail regions 10t. The sacrificial tail regions 10t may be generated by a step difference between the fin bodies 110 and the device isolation layers 200. The sacrificial tail regions 10t may be formed to protrude from side surfaces of the sacrificial gate assemblies 10.

Referring to FIGS. 8A to 8C, a method of forming the semiconductor device according to an exemplary embodiment of the inventive concept may include a process of forming gate spacers 350 on side surfaces of sacrificial gate assemblies 10.

The process of forming the gate spacers 350 may include a process of forming a spacer insulating layer including an insulating material, such as silicon carbon oxynitride (SiCON), on the substrate 100 on which the sacrificial gate assemblies 10 are formed, and a process of etching the spacer insulating layer.

The gate spacers 350 on the device isolation layers 200 may cover the sacrificial tail regions 10t of the sacrificial gate assemblies 10, as shown in FIG. 8B. The gate spacers 350 on the sacrificial tail regions 10*t* of the sacrificial gate assemblies 10 may be formed to be relatively thin.

Referring to FIGS. 9A to 9C, a method of forming the semiconductor device according to an exemplary embodiment of the inventive concept may include a process of forming fin recessed regions 100*r* between the gate spacers 350.

The process of forming the fin recessed regions 100*r* may include a process of recessing the fin bodies 110 exposed by the gate spacers 350. As a result of forming the fin recessed regions 100*r*, upper surfaces of the fin bodies 110 between the gate spacers 350 may be at lower levels than the upper surfaces of the fin bodies 110 on lower surfaces of the sacrificial gate assemblies 10.

Referring to FIGS. 10A to 10C, a method of forming the semiconductor device according to an exemplary embodiment of the inventive concept may include a process of forming epitaxial regions 400 between the gate spacers 350.

The process of forming the epitaxial regions 400 may include an epitaxial growth process of epitaxially growing the epitaxial regions 400 from the fin bodies 110 between the gate spacers 350. The epitaxial regions 400 may fill the fin recessed regions 100*r*. For example, the epitaxial regions 400 may include an epitaxial growth material grown from the fin bodies 110 exposed by the fin recessed regions 100*r*.

The epitaxial regions 400 may be spaced apart from one another. In an exemplary embodiment, distances between the adjacent epitaxial regions 400 may be different. The distance between adjacent epitaxial regions 400 may be in proportion to a distance between corresponding adjacent fin bodies 110. For example, the epitaxial regions 400 disposed on adjacent fin bodies 110 that are relatively close to each other may be disposed to be closer to each other than the epitaxial regions 400 disposed on adjacent fin bodies 110 that are relatively far from each other.

In an exemplary embodiment, edges of the epitaxial regions 400 may be gradually lowered as the level of upper surfaces thereof approach the gate spacers 350. For example, in an exemplary embodiment, upper surfaces of the epitaxial regions 400 between the gate spacers 350 may be formed in a gradual convex shape. Distances between upper surfaces of the fin bodies 110 and the upper surfaces of the epitaxial regions 400 may gradually decrease in a direction from the edges of the epitaxial regions 400 to the gate spacers 350.

Referring to FIGS. 11A to 11C, a method of forming a semiconductor device according to an exemplary embodiment of the inventive concept may include a process of forming a buffer layer 511 on the substrate 100 on which the epitaxial regions 400 are formed.

The process of forming the buffer layer 511 may include a process of depositing an insulating material, such as silicon oxide (SiO), on the substrate 100 on which the epitaxial regions 400 are formed. However, the process of forming the buffer layer 511 is not limited thereto.

In a method of forming a semiconductor device according to an exemplary embodiment of the inventive concept, the buffer layer 511 may be formed by silicon oxide (SiO). In a method of forming the semiconductor device according to an exemplary embodiment of the inventive concept, the buffer layer 511 may be formed to have an etch selectivity with respect to the gate spacers 350. For example, in a method of forming a semiconductor device according to an exemplary embodiment of the inventive concept, the buffer layer 511 may be formed of silicon nitride (SiN). However, the buffer layer 511 is not limited thereto.

Spaces between the adjacent epitaxial regions 400 may be blocked (e.g., filled in) by the buffer layer 511. For example, the buffer layer 511 may fill a space between adjacent epitaxial regions 400. Air gaps AG may be formed between the adjacent fin bodies 110 by the process of forming the buffer layer 511, the device isolation layers 200, the gate spacers 350, and the adjacent epitaxial regions 400. The air gaps AG may be surrounded by the buffer layer 511.

Figure 12A:
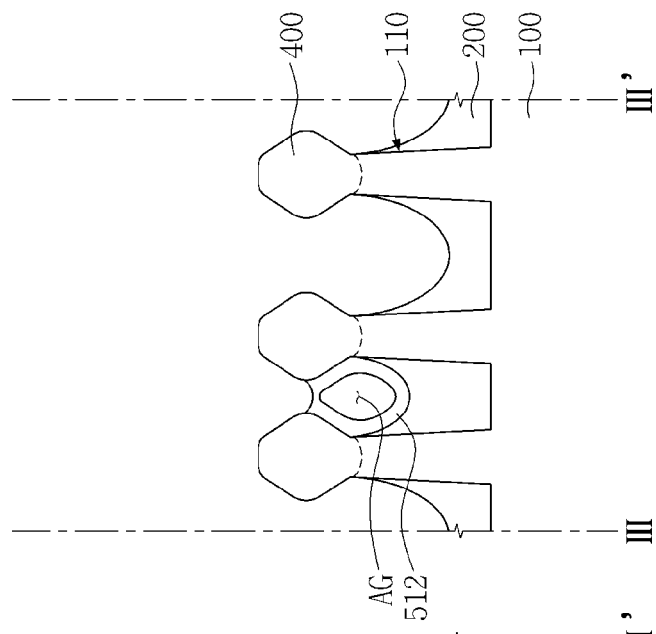
Figure 12B:
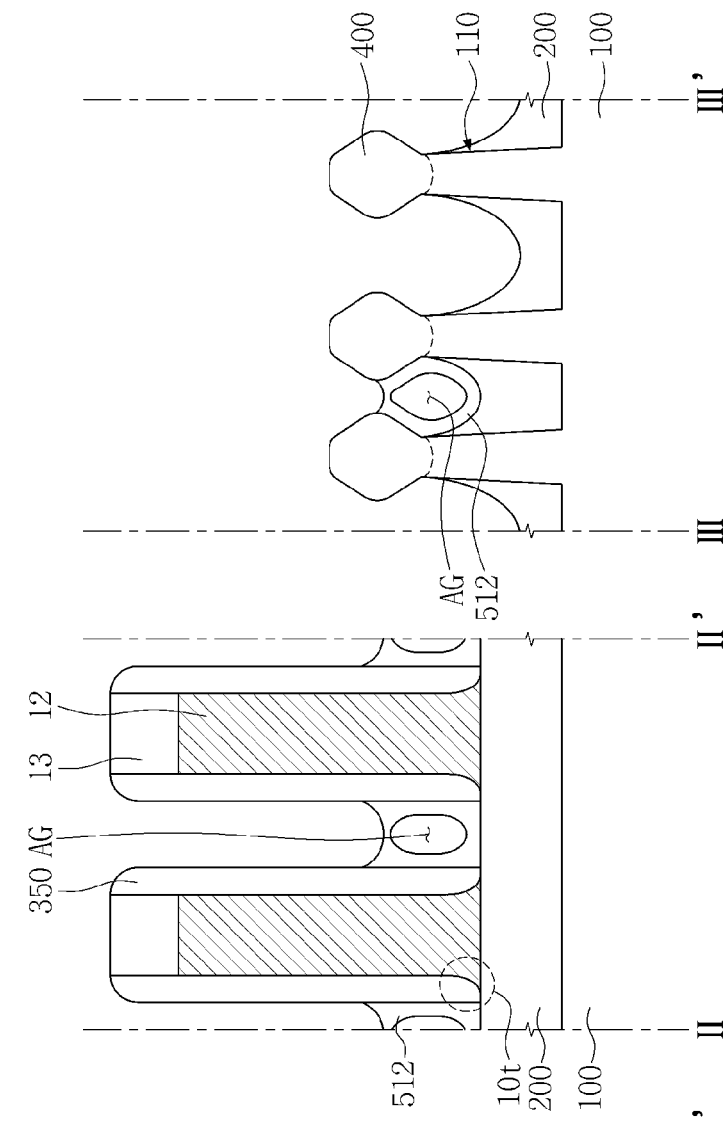
Figure 12C:
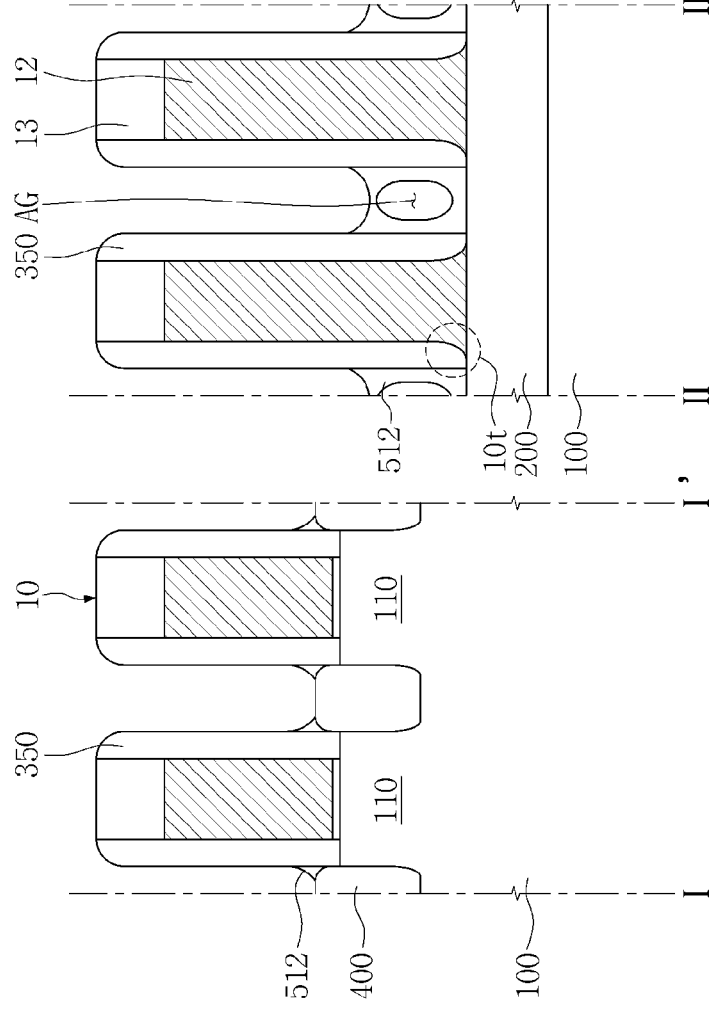

Referring to FIGS. 12A to 12C, a method of forming a semiconductor device according to an exemplary embodiment of the inventive concept may include a process of forming buffer patterns 512 on the substrate 100 on which the epitaxial regions 400 are formed.

The process of forming the buffer patterns 512 may include a process of etching the buffer layer 511. The buffer patterns 512 may cover edges of the epitaxial regions 400 between the gate spacers 350. The process of forming the buffer patterns 512 may include a process of removing the buffer layer 511 disposed on the device isolation layers 200. For example, the process of forming the buffer patterns 512 may include a process of wet etching the buffer layer 511. However, the process of forming the buffer patterns 512 is not limited thereto.

The buffer patterns 512 may surround the air gaps AG. The buffer patterns 512 may include the unetched buffer layer 511 between adjacent epitaxial regions 400. Upper surfaces of the buffer patterns 512 on the device isolation layers 200 may be bowl-shaped.

Referring to FIGS. 13A to 13C, a method of forming a semiconductor device according to an exemplary embodiment of the inventive concept may include a process of doping the epitaxial regions 400.

The process of doping the epitaxial regions 400 may include, for example, an ion implantation process. For example, the process of doping the epitaxial regions 400 may include a process of implanting, for example, phosphorous (P), arsenic (As), or boron (B) into the epitaxial regions 400. However, the process of doping the epitaxial regions 400 is not limited thereto.

In an exemplary embodiment of the inventive concept, the process of doping the epitaxial regions 400 may be performed in a state in which the buffer patterns 512 are formed. In the process of doping the epitaxial regions 400, the buffer patterns 512 may prevent the dopant from being doped in the direction of the fin bodies 110. Accordingly, in the method of forming a semiconductor device according to an exemplary embodiment of the inventive concept, the fin bodies 110 can be prevented from being doped in the process of doping the epitaxial regions 400. Therefore, in the method of forming a semiconductor device according to an exemplary embodiment of the inventive concept, a short channel effect may be prevented.

Referring to FIGS. 14A to 14D, a method of forming a semiconductor device according to an exemplary embodiment of the inventive concept may include a process of exposing the device isolation layers 200 disposed between adjacent epitaxial regions 400.

The process of exposing the device isolation layers 200 disposed between adjacent epitaxial regions 400 may include a process of forming an opening between the adjacent epitaxial regions 400. For example, the process of exposing the device isolation layers 200 disposed between adjacent epitaxial regions 400 may include a process of removing the buffer pattern 512 filling a space between adjacent epitaxial regions 400. The air gaps AG may be removed by the process of exposing the device isolation layers 200 disposed between the adjacent epitaxial regions 400.

The method of forming a semiconductor device according to an exemplary embodiment of the inventive concept may include forming inner spacer capping layers 611 by the process of exposing the device isolation layers 200 disposed between adjacent epitaxial regions 400. The inner spacer capping layers 611 may be, for example, portions of the buffer patterns 512 that remain after other portions of the buffer patterns 512 filling the spaces between adjacent epitaxial regions 400 are removed, as described above. The inner spacer capping layers 611 between the gate spacers 350 on the device isolation layers 200 may be U-shaped. The inner spacer capping layers 611 may extend only to lower side surfaces 400LS of the adjacent epitaxial regions 400 facing each other on the device isolation layers 200, as shown in FIG. 14D.

Figure 15A:
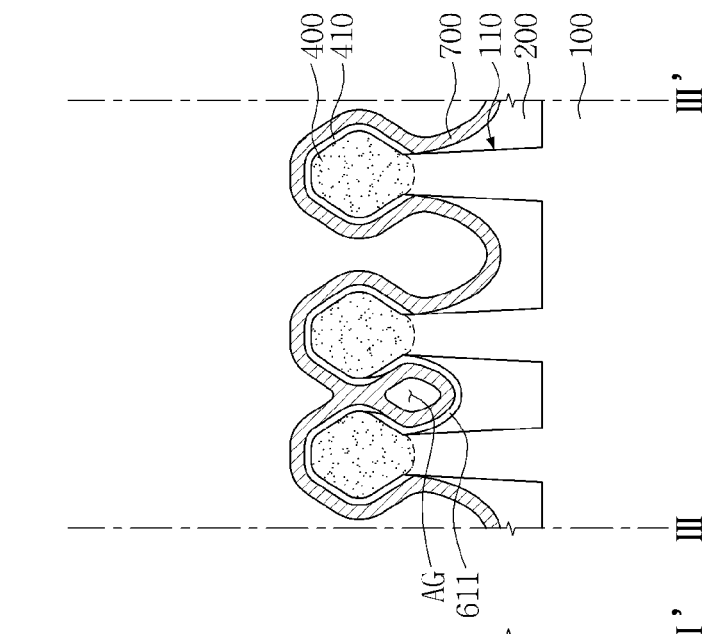
Figure 15B:
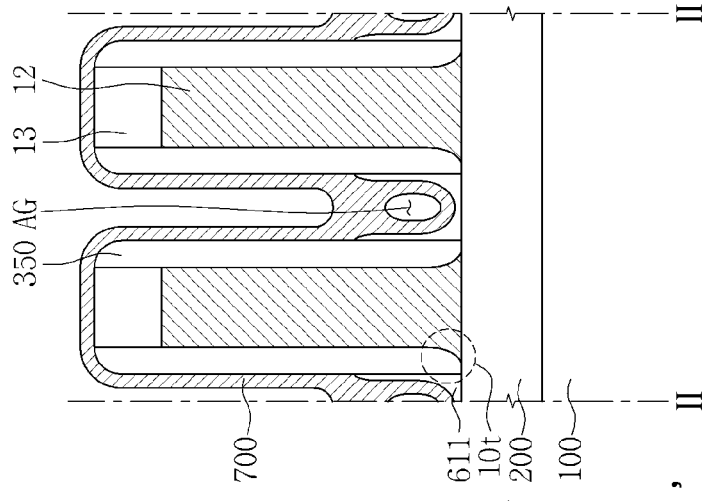
Figure 15C:
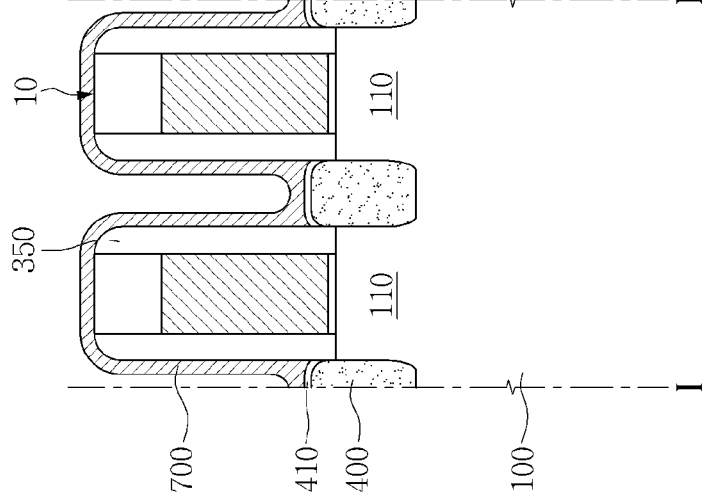

Referring to FIGS. 15A to 15C, a method of forming a semiconductor device according to an exemplary embodiment of the inventive concept may include a process of forming a stopper 700 on the substrate 100 on which the inner spacer capping layers 611 are formed.

The stopper 700 may have an etch selectivity with respect to the gate spacers 350. For example, the process of forming the stopper 700 may include a process of depositing an insulating material, such as silicon nitride (SiN), on the substrate 100 on which the inner spacer capping layers 611 are formed. However, the process of forming the stopper 700 is not limited thereto.

The stopper 700 may extend onto the inner spacer capping layers 611. The stopper 700 may block contact between adjacent epitaxial regions 400. A space between the adjacent epitaxial regions 400 may be filled with the stopper 700. Air gaps AG may be formed between the adjacent fin bodies 110 by the process of forming the stopper 700, the device isolation layers 200, the gate spacers 350, and the adjacent epitaxial regions 400. The air gaps AG may be surrounded by the stopper 700.

In the method of forming the semiconductor device according to an exemplary embodiment of the inventive concept, epitaxial oxide layers 410 may be formed between the epitaxial regions 400 and the stopper 700. The epitaxial oxide layers 410 may be, for example, natural oxide layers formed by oxidizing surfaces of the epitaxial regions 400. However, the epitaxial oxide layers 410 are not limited thereto. In an exemplary embodiment, the epitaxial oxide layers 410 may not be formed on lower side surfaces of the adjacent epitaxial regions 400 facing each other due to the inner spacer capping layers 611.

Referring to FIGS. 16A to 16C, a method of forming a semiconductor device according to an exemplary embodiment of the inventive concept may include a process of forming an interlayer insulating layer 800 on the substrate 100 on which the stopper 700 is formed.

The interlayer insulating layer 800 may be formed via, for example, a planarization process. The planarization process may include, for example, a chemical mechanical polishing (CMP) process. However, formation of the interlayer insulating layer 800 is not limited thereto.

Referring to FIGS. 17A to 17C, a method of forming a semiconductor device according to an exemplary embodiment of the inventive concept may include a process of removing sacrificial gate capping patterns 13.

The process of removing the sacrificial gate capping patterns 13 may include a process of exposing upper surfaces of the sacrificial gate electrodes 12. The process of exposing upper surfaces of the sacrificial gate electrodes 12 may include performing an etch back or planarization process on the substrate 100 on which the interlayer insulating layer 800 is formed. However, the process of removing the sacrificial gate capping patterns 13 is not limited thereto.

Figure 18A:
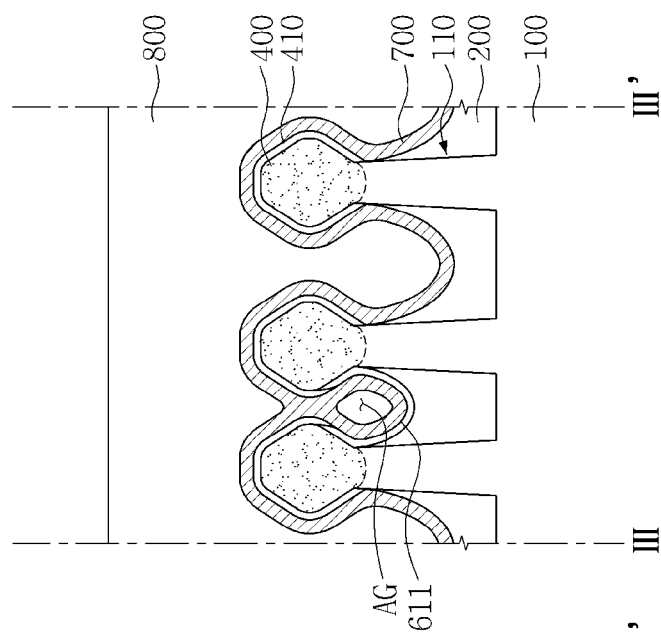
Figure 18B:
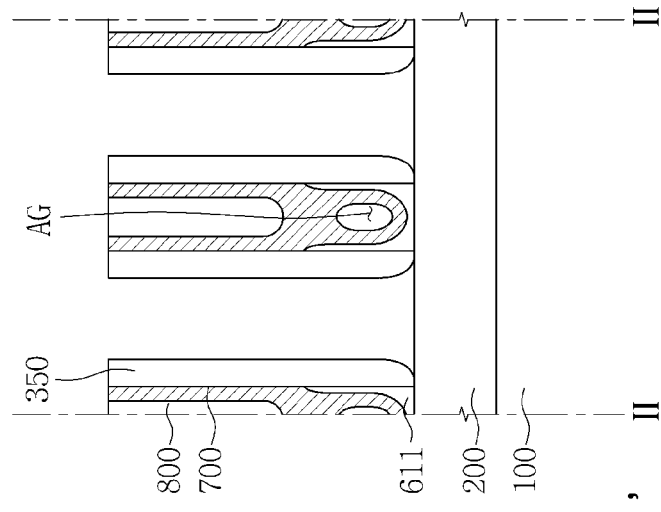
Figure 18C:
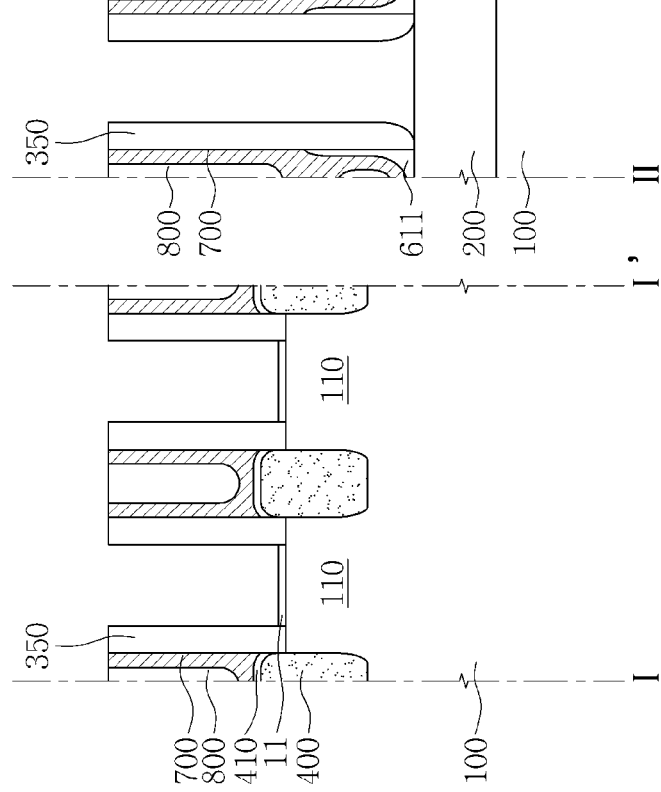

Referring to FIGS. 18A to 18C, a method of forming a semiconductor device according to an exemplary embodiment of the inventive concept may include a process of removing the sacrificial gate electrodes 12.

The device isolation layers 200 between the gate spacers 350 may be exposed by the process of removing the sacrificial gate electrodes 12.

Referring to FIGS. 19A to 19C, a method of forming a semiconductor device according to an exemplary embodiment of the inventive concept may include a process of forming gate trenches GT between the gate spacers 350.

The process of forming the gate trenches GT may include a process of removing the sacrificial gate insulating patterns 11. The device isolation layers 200 may be recessed by the process of removing the sacrificial gate insulating patterns 11. For example, gate recessed regions 900r may be formed by the process of forming the gate trenches GT on the device isolation layers 200 exposed between the gate spacers 350.

Referring to FIGS. 20A to 20C, a method of forming a semiconductor device according to an exemplary embodiment of the inventive concept may include a process of forming gate assemblies 300 in the gate trenches GT.

The process of forming the gate assemblies 300 may include a process of forming interface insulating layers 310, forming gate insulating layers 320, forming gate barrier layers 330, and forming gate electrodes 340.

The gate assemblies 300 may include gate tail regions 300t on the device isolation layers 200. The gate tail regions 300t may be formed to protrude from side surfaces of the gate assemblies 300. The gate tail regions 300t may be formed by sacrificial tail regions 10t. For example, the gate tail regions 300t may be the gate assemblies 300 filling the sacrificial tail regions 10t.

Regions of the gate spacers 350 that are relatively thin and/or have defects may be damaged in a process of removing the sacrificial gate assemblies 10. A material forming the gate assemblies 300 may fill the regions of the gate spacers 350 having defects in the process of forming the gate assemblies 300. In a method of forming the semiconductor device according to an exemplary embodiment of the inventive concept, the gate assemblies 300 may be formed in a state in which the stopper 700 is disposed between the gate spacers 350 and air gaps AG. Accordingly, in a method of forming the semiconductor device according to an exemplary embodiment of the inventive concept, the filling of the air gaps AG through the regions of the gate spacers 350 having defects by the material forming the gate assemblies 300 may be prevented. Therefore, in a method of forming a semiconductor device according to an exemplary embodiment of the inventive concept, a leakage current between the gate assemblies 300 and the epitaxial regions 400 may be blocked (e.g., reduced or prevented).

The gate assemblies 300 may fill the gate recessed regions 900r. In exemplary embodiments, lower surfaces of the gate assemblies 300 on the device isolation layers 200 may be at lower levels than upper surfaces of the device isolation layers 200. The lower surfaces of the gate assemblies 300 on the device isolation layers 200 may be at lower levels than lowermost ends of the gate spacers 350. The lower surfaces of the gate assemblies 300 on the device isolation layers 200 may be at lower levels than lower surfaces of the inner spacer capping layers 611.

Referring to FIGS. 21A to 21C, a method of forming a semiconductor device according to an exemplary embodiment of the inventive concept may include a process of forming contact holes CH on the substrate 100 on which the gate assemblies 300 are formed.

The process of forming the contact holes CH may include a process of removing the epitaxial oxide layer 410, the stopper 700, and the interlayer insulating layer 800 disposed on upper regions of the epitaxial regions 400.

The contact holes CH formed on adjacent epitaxial regions 400 may be connected to each other. For example, upper surfaces of adjacent epitaxial regions 400 may be exposed by one contact hole CH.

In a method of forming a semiconductor device according to an exemplary embodiment of the inventive concept, outer spacer capping layers 612 may be formed by the process of forming the contact holes CH. The outer spacer capping layers 612 may be the remaining stopper 700 between adjacent epitaxial regions 400 that is formed due to the process of forming the contact holes CH. The outer spacer capping layers 612 may surround the air gaps AG. Spaces between adjacent epitaxial regions 400 may be filled by the outer spacer capping layers 612. The inner spacer capping layers 611 and the outer spacer capping layers 612 may form spacer capping layers 610.

Referring to FIGS. 2A to 2D, a method of forming a semiconductor device according to an exemplary embodiment of the inventive concept may include a process of forming contact assemblies 900 in the contact holes CH.

The process of forming the contact assemblies 900 may include a process of forming silicide layers 910, forming contact barrier layers 920, and forming contact plugs 930.

FIGS. 22A to 25A, 22B to 25B, and 22C to 25C are cross-sectional views sequentially illustrating a method of forming a semiconductor device according to an exemplary embodiment of the inventive concept.

Referring to FIGS. 5A to 5C, 22A to 25A, 22B to 25B, and 22C to 25C, a method of forming a semiconductor device according to an exemplary embodiment of the inventive concept will be described. Referring to FIGS. 22A to 22C, a method of forming a semiconductor device according to an exemplary embodiment of the inventive concept may include a process of forming device isolation layers 200 between fin bodies 110 on a substrate 100, a process of forming sacrificial gate assemblies 10 substantially perpendicularly crossing the fin bodies 110 and the device isolation layers 200, a process of forming gate spacers 350 on side surfaces of the sacrificial gate assemblies 10, a process of forming epitaxial regions 400 on upper surfaces of the fin bodies 110 exposed by the gate spacers 350, and a process of forming a buffer layer 520 on the substrate 100 on which the epitaxial regions 400 are formed.

The process of forming the buffer layer 520 may include a process of depositing a material having an etch selectivity with respect to the gate spacers 350 on the substrate 100 on which the epitaxial regions 400 are formed. For example, the buffer layer 520 may include silicon nitride (SiN). However, the buffer layer 520 is not limited thereto.

A space between adjacent epitaxial regions 400 may be filled with the buffer layer 520. As a result of forming the buffer layer 520, air gaps AG may be formed between adjacent fin bodies 110, the device isolation layers 200, the gate spacers 350, and the adjacent epitaxial regions 400.

Referring to FIGS. 23A to 23C, a method of forming a semiconductor device according to an exemplary embodiment of the inventive concept may include a process of forming spacer capping layers 620 surrounding the air gaps AG and a process of doping the epitaxial regions 400.

The process of forming the spacer capping layers 620 may include a process of wet etching the buffer layer 520. The spacer capping layers 620 may include the remaining buffer layer 520 between adjacent epitaxial regions 400. Upper surfaces of the spacer capping layers 620 on the device isolation layers 200 may be bowl-shaped.

The spacer capping layers 620 may cover edges of the epitaxial regions 400 between the gate spacers 350. The spacer capping layers 620 may prevent the fin bodies 110 from being doped during the process of doping the epitaxial regions 400.

Referring to FIGS. 24A to 24C, a method of forming a semiconductor device according to an exemplary embodiment of the inventive concept may include a process of forming a stopper 700 on the substrate 100 on which the spacer capping layers 620 are formed.

Figure 25A:
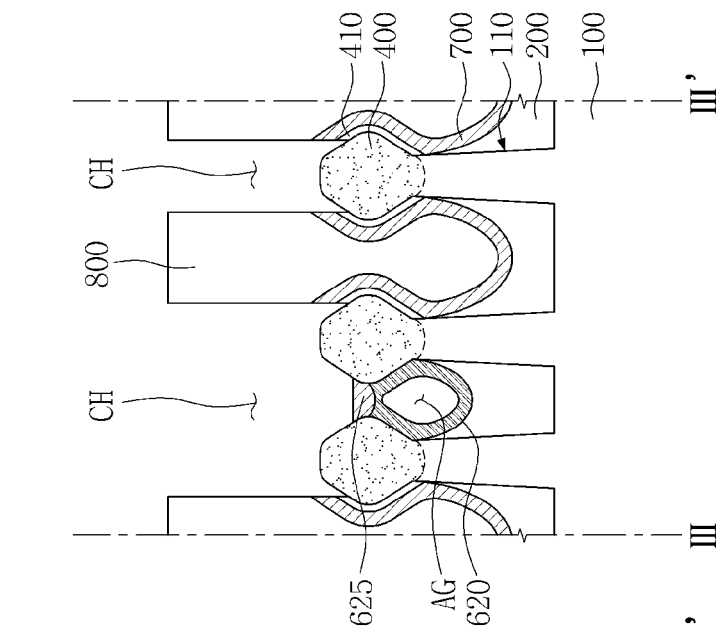
Figure 25B:
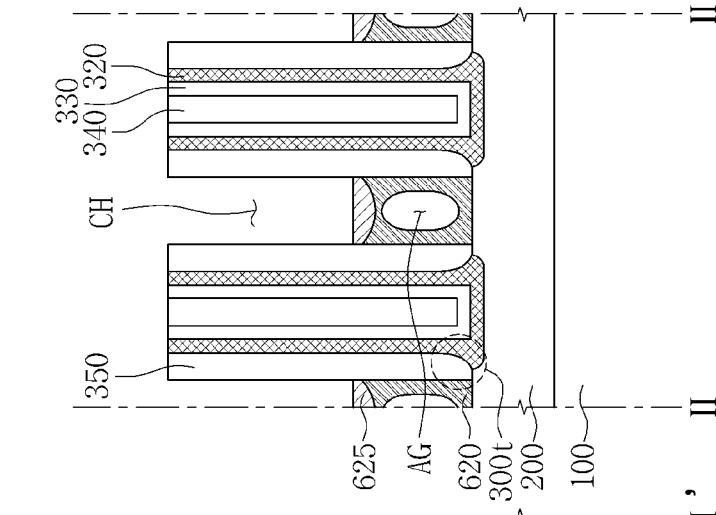
Figure 25C:
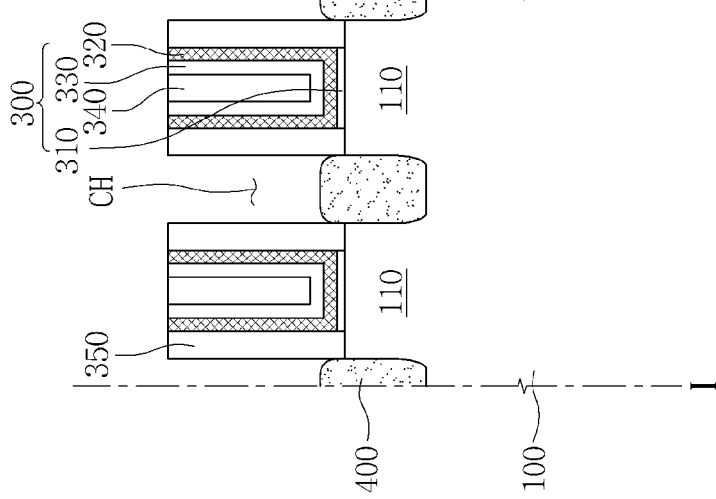

Referring to FIGS. 25A to 25C, a method of forming a semiconductor device according to an exemplary embodiment of the inventive concept may include a process of forming an interlayer insulating layer 800, a process of removing sacrificial gate assemblies 10, a process of forming gate assemblies 300, and a process of forming contact holes CH.

In a method of forming a semiconductor device according to an exemplary embodiment of the inventive concept, the spacer capping layers 620 which cover edges of the epitaxial regions 400 may be removed by the process of forming the contact holes CH.

In a method of forming a semiconductor device according to an exemplary embodiment of the inventive concept, upper capping patterns 625 may be formed by the process of forming the contact holes CH. The upper capping patterns 625 may be disposed on upper surfaces of the spacer capping layers 620. The upper capping pattern 625 may be portions of the stopper 700 that remain between adjacent epitaxial regions 400 due to the process of forming the contact holes CH. Spaces between adjacent epitaxial regions 400 may be filled with the spacer capping layers 620 and the upper capping patterns 625.

Referring to FIGS. 5A to 5C, a method of forming a semiconductor device according to an exemplary embodiment of the inventive concept may include a process of forming contact assemblies 900 in the contact holes CH.

The contact assemblies 900 may include, for example, a silicide layer 910, a contact barrier layer 920, and a contact plug 930.

FIGS. 26A to 29A, 26B to 29B, and 26C to 29C are cross-sectional views sequentially illustrating a method of forming a semiconductor device according to an exemplary embodiment of the inventive concept.

Figure 26A:
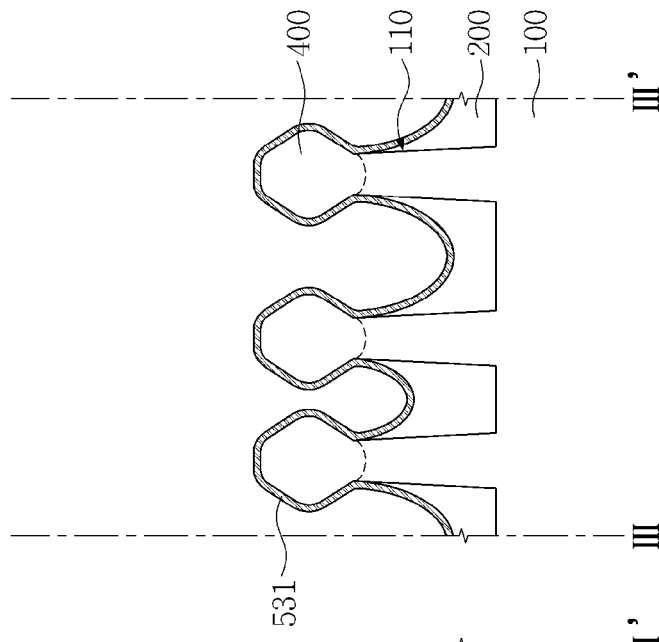
Figure 26B:
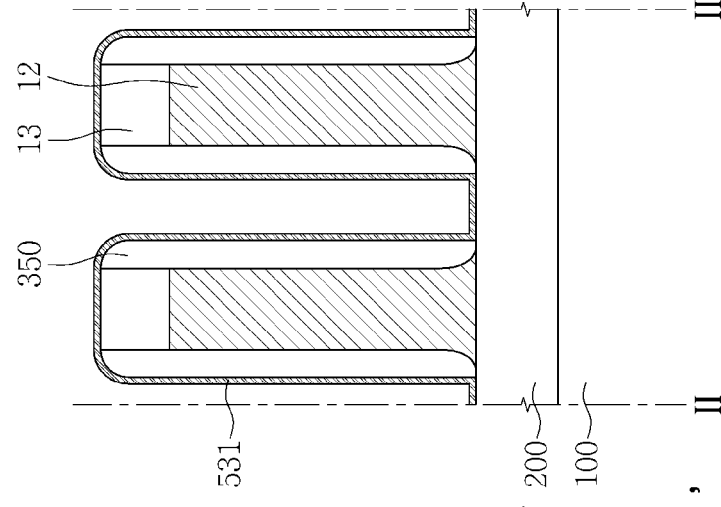
Figure 26C:
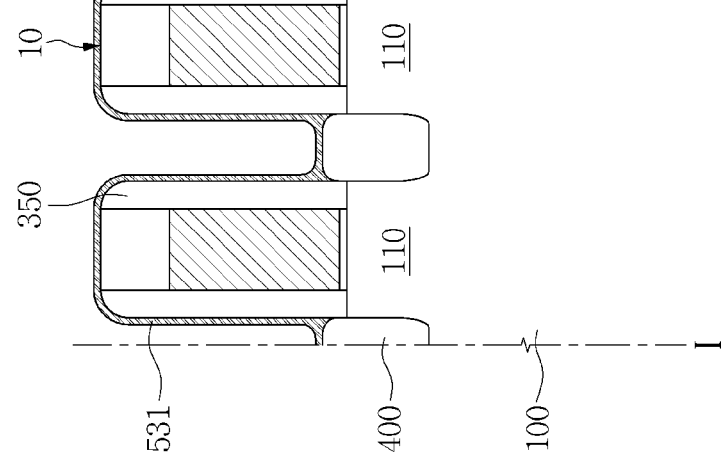

Referring to FIGS. 6A to 6C, 26A to 29A, 26B to 29B, and 26C to 29C, a method of forming a semiconductor device according to an exemplary embodiment of the inventive concept will be described. Referring to FIGS. 26A to 26C, a method of forming a semiconductor device according to an exemplary embodiment of the inventive concept may include a process of preparing a substrate 100 including fin bodies 110, a process of forming device isolation layers 200, a process of forming sacrificial gate assemblies 10, a process of forming gate spacers 350, a process of forming epitaxial regions 400, and a process of forming an inner buffer layer 531.

The process of forming the inner buffer layer 531 may include a process of depositing an insulating material having an etch selectivity with respect to the gate spacers 350 on the substrate 100 on which the epitaxial regions 400 are formed. For example, the inner buffer layer 531 may be formed by silicon nitride (SiN). However, the process of forming the inner buffer layer 531 is not limited thereto.

Referring to FIGS. 27A to 27C, a method of forming a semiconductor device according to an exemplary embodiment of the inventive concept may include a process of forming an outer buffer layer 532 on the inner buffer layer 531.

The process of forming the outer buffer layer 532 may include a process of depositing an insulating material having an etch selectivity with respect to the inner buffer layer 531. For example, the outer buffer layer 532 may be formed by silicon oxide (SiO). However, forming the outer buffer layer 532 is not limited thereto.

The process of forming the outer buffer layer 532 may include a process of forming air gaps AG between the adjacent fin bodies 110, the device isolation layers 200, the gate spacers 350, and the adjacent epitaxial regions 400.

A thickness of the outer buffer layer 532 may be different from that of the inner buffer layer 531. For example, the outer buffer layer 532 may be formed to be thicker than the inner buffer layer 531.

Referring to FIGS. 28A to 28C, a method of forming a semiconductor device according to an exemplary embodiment of the inventive concept may include a process of forming spacer capping layers 630 on the substrate 100 on which the epitaxial regions 400 are formed and a process of doping the epitaxial regions 400.

The process of forming the spacer capping layers 630 may include a process of etching the inner buffer layer 531 and the outer buffer layer 532. The spacer capping layers 630 may include inner spacer capping layers 631 and outer spacer capping layers 632. The inner spacer capping layer 631 and the outer spacer capping layer 632 may be portions of the inner buffer layer 531 and the outer buffer layer 532 that remain between adjacent epitaxial regions 400 due to the process of forming the spacer capping layers 630.

Upper surfaces of the outer spacer capping layers 632 may be connected to upper surfaces of the inner spacer capping layers 631. The upper surfaces of the inner spacer capping layers 631 and upper surfaces of the outer spacer capping layers 632 may be continuous. Upper surfaces of the spacer capping layers 630 on the device isolation layers 200 may be bowl-shaped.

The spacer capping layers 630 may cover edges of the epitaxial regions 400 between the gate spacers 350.

In the method of forming a semiconductor device according to an exemplary embodiment of the inventive concept, only the inner spacer capping layers 631 have been described as being formed on edges of epitaxial regions 400. However, exemplary embodiments of the inventive concept are not limited thereto. For example, in a method of forming a semiconductor device according to exemplary embodiments of the inventive concept, edges of the epitaxial regions 400 may be covered by the inner spacer capping layers 631 and the outer spacer capping layers 632.

Referring to FIGS. 29A to 29C, a method of forming a semiconductor device according to an exemplary embodiment of the inventive concept may include a process of forming a stopper 700 on the substrate 100 on which the spacer capping layers 630 are formed.

Referring to FIGS. 6A to 6C, a method of forming a semiconductor device according to an exemplary embodiment of the inventive concept may include a process of forming an interlayer insulating layer 800, a process of removing sacrificial assemblies 10, a process of forming gate assemblies 300, and a process of forming contact assemblies 900.

Figure 30:
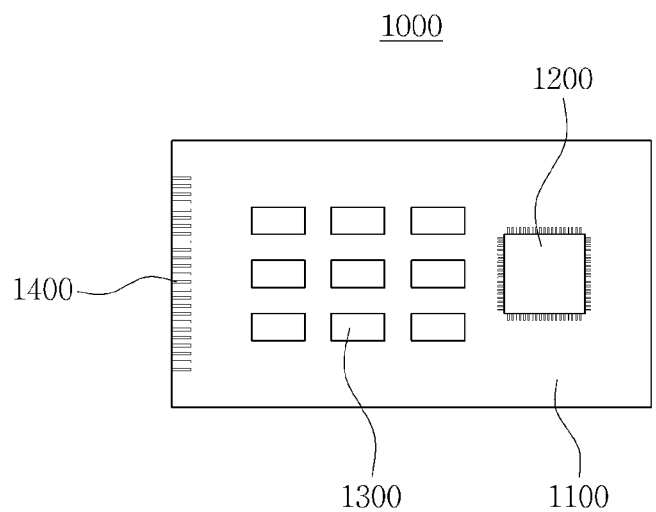
FIG. 30 is a view illustrating a semiconductor module including a semiconductor device according to an exemplary embodiment of the inventive concept.

FIG. 30 is a view showing a semiconductor module including a semiconductor device according to an exemplary embodiment of the inventive concept.

Referring to FIG. 30, a semiconductor module 1000 may include a module substrate 1100, a microprocessor 1200, a plurality of memories 1300, and input/output terminals 1400. The microprocessor 1200, the memories 1300, and the input/output terminals 1400 may be installed on the module substrate 1100. The semiconductor module 1000 may include a plurality of memory cards and/or card packages. In an exemplary embodiment, a single memory 1300 may be utilized instead of a plurality of memories 1300.

The microprocessor 1200 and the memories 1300 may include the semiconductor devices described herein according to exemplary embodiments of the inventive concept. Therefore, the reliability of the microprocessor 1200 and the memories 1300 in the semiconductor module 1000 may be improved.

Figure 31:
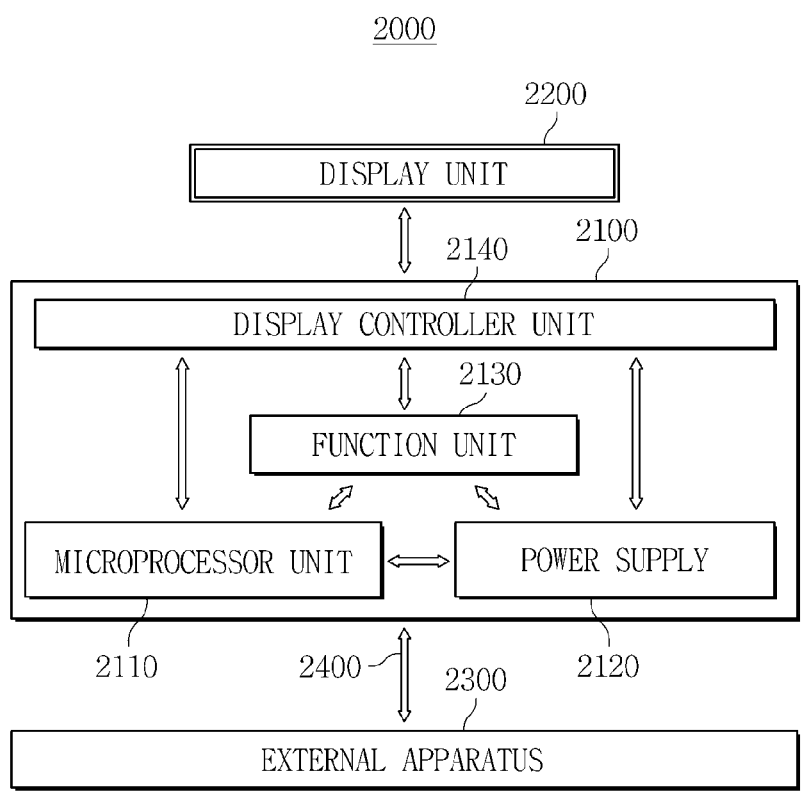
FIG. 31 is a block diagram illustrating a mobile system including a semiconductor device according to an exemplary embodiment of the inventive concept.

FIG. 31 is a block diagram showing a mobile system including a semiconductor device according to exemplary embodiments of the inventive concept.

Referring to FIG. 31, a mobile system 2000 may include a body unit 2100, a display unit 2200, and an external apparatus 2300. The body unit 2100 may include a microprocessor unit 2110, a power supply 2120, a function unit 2130, and a display controller unit 2140. However, the body unit 2100 and the mobile system 2000 are not limited thereto.

The body unit 2100 may be a system board or a motherboard such as, for example, a printed circuit board (PCB). The microprocessor unit 2110, the power supply 2120, the function unit 2130, and the display controller unit 2140 may be installed or mounted on the body unit 2100.

The microprocessor unit 2110 may receive a voltage from the power supply 2120 and may control the function unit 2130 and the display controller unit 2140. The power supply 2120 may receive a constant voltage from a power source (e.g., an external power source), divide the voltage into various levels of required voltages, and supply the voltages to the microprocessor unit 2110, the function unit 2130, and the display controller unit 2140.

The power supply 2120 may include a power management IC (PMIC). The power management IC may efficiently supply voltages to the microprocessor unit 2110, the function unit 2130, and the display controller unit 2140.

The function unit 2130 may perform various functions of the mobile system 2000. For example, the function unit 2130 may include several components which perform wireless communication functions such as, for example, outputting an image to the display unit 2200, outputting audio (e.g., a voice) to a speaker, etc., by communicating with (e.g., dialing) the external apparatus 2300. For example, the function unit 2130 may serve as an image processor. However, the function unit 2130 is not limited thereto.

The function unit 2130 may serve as a memory card controller when the mobile system 2000 is connected to a memory card for expansion of the memory capacity. The function unit 2130 may serve as an interface controller when the mobile system 2000 includes a Universal Serial Bus (USB) to expand functionality. However, the function unit 2130 is not limited thereto.

The display unit 2200 may be electrically connected to the body unit 2100. For example, the display unit 2200 may be electrically connected to the display controller unit 2140 of body unit 2100. The display unit 2200 may display an image processed by the display controller unit 2140 of the body unit 2100.

The microprocessor unit 2110 and the function unit 2130 of the body unit 2100 may include semiconductor devices described herein according to exemplary embodiments of the inventive concept. Therefore, the reliability of the mobile system 2000 may be improved.

Figure 32:
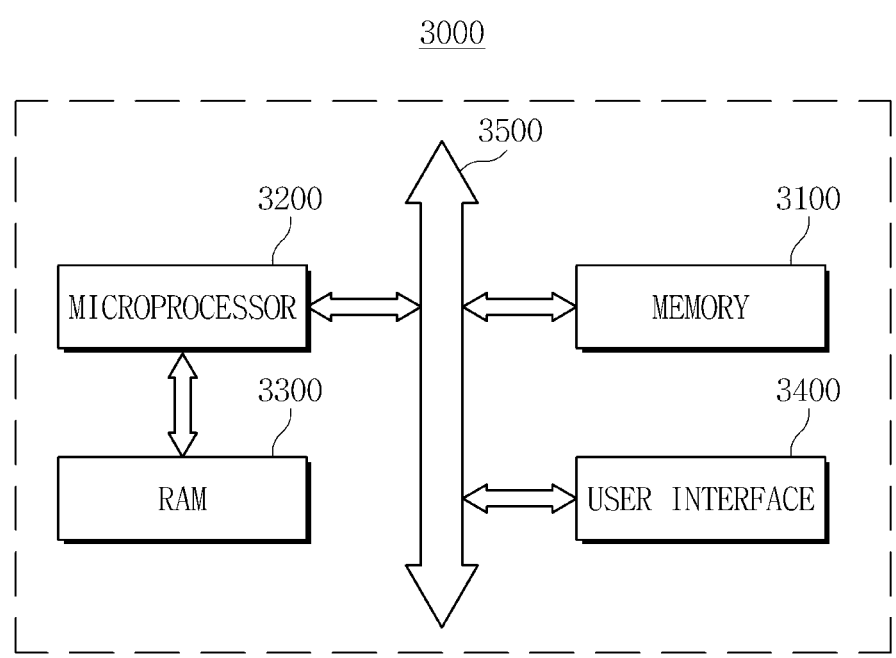
FIG. 32 is a block diagram illustrating an electronic system including a semiconductor device according to an exemplary embodiment of the inventive concept.

FIG. 32 is a block diagram showing an electronic system including a semiconductor device according to exemplary embodiments of the inventive concept.

Referring to FIG. 32, an electronic system 3000 may include a memory 3100, a microprocessor 3200, a random access memory (RAM) 3300, and a user interface 3400. The electronic system 3000 may be, for example, a light emitting diode (LED) lighting, a refrigerator, an air conditioner, an industrial cutter, a welding machine, a car, a ship, an aircraft, a satellite, etc. However, the electronic system 3000 is not limited thereto.

The memory 3100 may store codes for booting the microprocessor 3200, data processed by the microprocessor 3200, or external input data. The memory 3100 may include a controller.

The microprocessor 3200 may program and control the electronic system 3000. The RAM 3300 may be used as an operational memory of the microprocessor 3200.

The user interface 3400 may perform data communication using a bus 3500. The user interface 3400 may be used to input data into or output data from the electronic system 3000.

The memory 3100, the microprocessor 3200, and the RAM 3300 may include the semiconductor devices described herein according to exemplary embodiments of the inventive concept. Therefore, the reliability of the electronic system 3000 according to exemplary embodiments of the inventive concept may be improved.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
a gate assembly disposed on a device isolation layer;
a gate spacer disposed on a side surface of the gate assembly;
a contact assembly disposed on the gate spacer;
an air gap disposed between the device isolation layer and the contact assembly;
a first spacer capping layer disposed between the gate spacer and the air gap,
wherein the first spacer capping layer has an etch selectivity with respect to the gate spacer, and
a second spacer capping layer disposed between the gate spacer and the first spacer capping layer,
wherein the second spacer capping layer has an etch selectivity with respect to the first spacer capping layer,
wherein the first spacer capping layer surrounds the air gap such that the contact assembly including a conductive material is spaced apart from the air gap by the first spacer capping layer including an insulating material.

2. The semiconductor device of claim 1, wherein an uppermost end of the second spacer capping layer is at a lower level than an uppermost end of the first spacer capping layer.

3. The semiconductor device of claim 1, wherein the second spacer capping layer extends between the device isolation layer and the first spacer capping layer.

4. The semiconductor device of claim 1, wherein the first spacer capping layer directly contacts at least a portion of the gate spacer.

5. The semiconductor device of claim 1, wherein the gate spacer includes silicon carbon oxynitride (SiCON), and the first spacer capping layer includes silicon nitride (SiN).

6. A semiconductor device, comprising:
a substrate comprising a first fin body and a second fin body spaced apart from the first fin body;
a device isolation layer disposed between the first fin body and the second fin body;
a gate assembly disposed on the substrate;
a gate spacer disposed on a side surface of the gate assembly;
a contact assembly disposed on the gate spacer;
an air gap disposed between the first fin body and the second fin body;
a first spacer capping layer surrounding the air gap and having an etch selectivity with respect to the gate spacer, and
a second spacer capping layer disposed between the gate spacer and the first spacer capping layer,
wherein the second spacer capping layer has an etch selectivity with respect to the first spacer capping layer,
wherein the first spacer capping layer surrounds the air gap such that the contact assembly including a conductive material is spaced apart from the air gap by the first spacer capping layer including an insulating material.

7. The semiconductor device of claim 6, wherein the first spacer capping layer contacts the gate spacer.

8. The semiconductor device of claim 6, further comprising:
a first epitaxial region disposed on the gate spacer and on an upper surface of the first fin body; and
a second epitaxial region disposed on the gate spacer and on an upper surface of the second tin body, wherein the second epitaxial region is spaced apart, from the first epitaxial region,
wherein the second spacer capping layer extends onto lower side surfaces of the first epitaxial region and the second epitaxial region, wherein the lower side surfaces of the first epitaxial region and the second epitaxial region face each other.

9. The semiconductor device of claim 8, wherein the second spacer capping layer directly contacts the lower side surfaces of the first epitaxial region and the second epitaxial region.

10. The semiconductor device of claim 8, wherein a space between the first epitaxial region and the second epitaxial region is filled by the second spacer capping layer.

11. The semiconductor device of claim 6, wherein the first spacer capping layer comprises silicon nitride.

12. The semiconductor device of claim 6, wherein a lower surface of the gate assembly is lower than a lower surface of the second spacer capping layer.

13. The semiconductor device of claim 12, wherein a lowermost end of the gate spacer is at substantially a same level as the lower surface of the second spacer capping layer.

14. A semiconductor device, comprising;
a plurality of gate assemblies disposed on a device isolation layer;
a plurality of gate spacers disposed on side surfaces of the gate assemblies;
a plurality of contact assemblies disposed on the gate spacers;
a plurality of air gaps disposed between the gate spacers;

a plurality of first spacer capping layers disposed between the gate spacers and the air gaps, wherein the first spacer capping layers have an etch selectivity with respect to the gate spacers, wherein an uppermost end of the first spacer capping layers is higher than an uppermost end of the air gaps, and a plurality of second spacer capping layers disposed between the gate spacers and the first spacer capping layers, wherein the second spacer capping layers have an etch selectivity with respect to the first spacer capping layers, wherein the first spacer capping layers surround the air gaps such that the contact assemblies including a conductive material are spaced apart from the air gaps by the first spacer capping layers including an insulating material.

15. The semiconductor device of claim 14, wherein the second spacer capping layers extend along an upper surface of the device isolation layer.

16. The semiconductor device of claim 15, wherein each of the second spacer capping layers disposed between the gate assemblies is U-shaped.

* * * * *